US006828977B2

(12) United States Patent
Champion

(10) Patent No.: US 6,828,977 B2
(45) Date of Patent: *Dec. 7, 2004

(54) DYNAMIC BUFFER PAGES

(75) Inventor: Mark Champion, Kenmore, WA (US)

(73) Assignees: Sony Corporation, Toyko (JP); Sony Electronics Inc., Park Ridge, NJ (US)

( * ) Notice: Subject to any disclaimer, the term of this patent is extended or adjusted under 35 U.S.C. 154(b) by 146 days.

This patent is subject to a terminal disclaimer.

(21) Appl. No.: 10/075,775

(22) Filed: Feb. 13, 2002

(65) Prior Publication Data

US 2002/0109692 A1 Aug. 15, 2002

Related U.S. Application Data

(60) Provisional application No. 60/269,783, filed on Feb. 15, 2001, provisional application No. 60/324,498, filed on Sep. 24, 2001, and provisional application No. 60/269,784, filed on Feb. 15, 2001.

(51) Int. Cl.[7] .................................................. G09G 5/39

(52) U.S. Cl. ........................ 345/531; 345/540; 345/543; 345/545

(58) Field of Search ................................. 345/531, 536, 345/537, 539, 545, 546, 542, 543, 540

(56) References Cited

U.S. PATENT DOCUMENTS

| 4,449,199 A | | 5/1984 | Daigle |
| 5,142,276 A | | 8/1992 | Moffat |
| 5,195,182 A | | 3/1993 | Sasson |
| 5,303,341 A | * | 4/1994 | Rivshin ...................... 358/1.17 |
| 5,479,605 A | * | 12/1995 | Saitoh ......................... 345/561 |
| 5,559,953 A | | 9/1996 | Seiler et al. |

(List continued on next page.)

OTHER PUBLICATIONS

*SMPTE Standard for Television 1920 x1080 Scanning and Analog and Parallel Digital Interfaces for Multiple Picture Rates*; SMPTE 274–1998; Copyright 1998; pp. 1–24; Revision of ANSI/SMPTE 274M–1995; The Society of Motion Picture and Television Engineers; White Plains, New York.

Bloom, D.M.; *The Grating Light Valve: revolutionizing display technology*; pp. 1–10; Silicon Light Machines (formerly Echelle, Inc.).

Corrigan, R.W., et al.; *An Alternative Architecture for High Performance Display*; Presented at the 141st SMPTE Technical Conference and Exhibition; Nov. 20, 1999, New York, New York; pp. 1–5; Silicon Machines, Sunnyvale, CA.

(List continued on next page.)

*Primary Examiner*—Matthew C. Bella
*Assistant Examiner*—Mackly Monestime
(74) *Attorney, Agent, or Firm*—Thomas F. Lebens; Fitch, Even, Tabin & Flannery

(57) ABSTRACT

Methods and apparatus for adjusting the geometry of buffer pages. In one implementation, a buffer page system includes: a data source, providing data elements in a first order; a data destination, receiving data elements in a second order, where each data element corresponds to an entry in one of a plurality of buffer pages, each buffer page having a plurality of entries along a first dimension corresponding to the first order and a plurality of entries along a second dimension corresponding to the second order; at least one memory device, each memory device having a plurality of memory pages including a plurality of memory locations, each memory location having an address, where data elements are stored to each memory device in the first order and retrieved from each memory device in the second order, and where each memory page stores data elements in multiple locations according to the first order and stores data elements in multiple locations according to the second order; and a buffer page controller, where the buffer page controller controls the geometry of each buffer page.

28 Claims, 20 Drawing Sheets

U.S. PATENT DOCUMENTS

| | | | |
|---|---|---|---|
| 5,561,777 | A | 10/1996 | Kao et al. |
| 5,579,473 | A * | 11/1996 | Schlapp et al. ............. 345/557 |
| 5,606,650 | A | 2/1997 | Kelley et al. |
| 5,619,471 | A | 4/1997 | Nunziata |
| 5,633,726 | A | 5/1997 | Timmermans |
| 5,781,201 | A | 7/1998 | McCormack et al. |
| 5,794,016 | A | 8/1998 | Kelleher |
| 5,798,843 | A | 8/1998 | Yamamoto et al. |
| 5,815,167 | A | 9/1998 | Muthal et al. |
| 5,815,169 | A | 9/1998 | Oda |
| 5,831,926 | A | 11/1998 | Norris et al. |
| 5,924,111 | A | 7/1999 | Huang et al. |
| 5,933,154 | A | 8/1999 | Howard et al. |
| 6,005,592 | A | 12/1999 | Koizumi et al. |
| 6,023,745 | A | 2/2000 | Lu |
| 6,031,638 | A | 2/2000 | Rao et al. |
| 6,111,992 | A | 8/2000 | Likhterov et al. |
| 6,177,922 | B1 * | 1/2001 | Schiefer et al. ............. 345/698 |
| 6,226,709 | B1 | 5/2001 | Goodwin et al. |
| 6,259,459 | B1 | 7/2001 | Middleton |
| 6,278,645 | B1 | 8/2001 | Buckelew et al. |
| 6,282,603 | B1 | 8/2001 | Rao |
| 6,301,649 | B1 | 10/2001 | Baker et al. |
| 6,331,854 | B1 | 12/2001 | Rogers et al. |
| 6,347,344 | B1 * | 2/2002 | Baker et al. .................. 710/20 |
| 6,417,867 | B1 | 7/2002 | Hallberg |
| 6,496,192 | B1 | 12/2002 | Shreesha et al. |
| 6,519,673 | B1 | 2/2003 | Chudnovsky |
| 6,549,207 | B1 | 4/2003 | Matsumoto |
| 6,567,531 | B1 | 5/2003 | Kondo et al. |
| 6,587,112 | B1 | 7/2003 | Goeltzenleuchter et al. |
| 6,665,749 | B1 | 12/2003 | Ansari |
| 2002/0109689 | A1 | 8/2002 | Champion et al. |
| 2002/0109690 | A1 | 8/2002 | Champion et al. |
| 2002/0109691 | A1 | 8/2002 | Champion |
| 2002/0109693 | A1 | 8/2002 | Champion et al. |
| 2002/0109694 | A1 | 8/2002 | Champion et al. |
| 2002/0109695 | A1 | 8/2002 | Champion et al. |
| 2002/0109696 | A1 | 8/2002 | Champion et al. |
| 2002/0109698 | A1 | 8/2002 | Champion et al. |
| 2002/0109699 | A1 | 8/2002 | Champion |
| 2002/0109791 | A1 | 8/2002 | Champion |
| 2002/0109792 | A1 | 8/2002 | Champion |
| 2002/0110030 | A1 | 8/2002 | Champion |
| 2002/0110351 | A1 | 8/2002 | Champion et al. |
| 2002/0113904 | A1 | 8/2002 | Champion |
| 2002/0130876 | A1 | 9/2002 | Champion |
| 2002/0149596 | A1 | 10/2002 | Champion |
| 2003/0151609 | A1 | 8/2003 | Champion |

OTHER PUBLICATIONS

Hearn, D., et al.; *Computer Graphics C Version* [2d Ed.]; pp. 53–56; Prentice Hall, Upper Saddle River, New Jersey.

McCarron, D., et al.; Accelerating PC Graphics, Emerging Technologies Edition, Market Strategy and Forecast Report; 1995; pp. 2–49 through 2–93, 2–159 (labeled as pp. 1–46); Mercury Research.

Lieberman, David; Sony champions MEMS display technology; EE Times, Jul. 14, 2000; http://www.eetimes.com/story/OEG20000714S0004.

* cited by examiner

| 0 | 1 | 2 | 3 | 4 | 5 | 6 | 7 |
|---|---|---|---|---|---|---|---|
| 8 | 9 | 10 | 11 | 12 | 13 | 14 | 15 |
| 16 | 17 | 18 | 19 | 20 | 21 | 22 | 23 |
| 24 | 25 | 26 | 27 | 28 | 29 | 30 | 31 |

| 0 | 2 | 4 | 6 |
|---|---|---|---|
| 8 | 10 | 12 | 14 |
| 16 | 18 | 20 | 22 |
| 24 | 26 | 28 | 30 |

| 1 | 3 | 5 | 7 |
|---|---|---|---|
| 9 | 11 | 13 | 15 |
| 17 | 19 | 21 | 23 |
| 25 | 27 | 29 | 31 |

FIG. 7

| 725 → | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| | 16 | 17 | 18 | 19 | 20 | 21 | 22 | 23 | 24 | 25 | 26 | 27 | 28 | 29 | 30 | 31 |
| | 32 | 33 | 34 | 35 | 36 | 37 | 38 | 39 | 40 | 41 | 42 | 43 | 44 | 45 | 46 | 47 |
| | 48 | 49 | 50 | 51 | 52 | 53 | 54 | 55 | 56 | 57 | 58 | 59 | 60 | 61 | 62 | 63 |
| | 64 | 65 | 66 | 67 | 68 | 69 | 70 | 71 | 72 | 73 | 74 | 75 | 76 | 77 | 78 | 79 |
| | 80 | 81 | 82 | 83 | 84 | 85 | 86 | 87 | 88 | 89 | 90 | 91 | 92 | 93 | 94 | 95 |
| | 96 | 97 | 98 | 99 | 100 | 101 | 102 | 103 | 104 | 105 | 106 | 107 | 108 | 109 | 110 | 111 |
| | 112 | 113 | 114 | 115 | 116 | 117 | 118 | 119 | 120 | 121 | 122 | 123 | 124 | 125 | 126 | 127 |
| | 128 | 129 | 130 | 131 | 132 | 133 | 134 | 135 | 136 | 137 | 138 | 139 | 140 | 141 | 142 | 143 |
| | 144 | 145 | 146 | 147 | 148 | 149 | 150 | 151 | 152 | 153 | 154 | 155 | 156 | 157 | 158 | 159 |
| | 160 | 161 | 162 | 163 | 164 | 165 | 166 | 167 | 168 | 169 | 170 | 171 | 172 | 173 | 174 | 175 |
| | 176 | 177 | 178 | 179 | 180 | 181 | 182 | 183 | 184 | 185 | 186 | 187 | 188 | 189 | 190 | 191 |
| | 192 | 193 | 194 | 195 | 196 | 197 | 198 | 199 | 200 | 201 | 202 | 203 | 204 | 205 | 206 | 207 |
| | 208 | 209 | 210 | 211 | 212 | 213 | 214 | 215 | 216 | 217 | 218 | 219 | 220 | 221 | 222 | 223 |
| | 224 | 225 | 226 | 227 | 228 | 229 | 230 | 231 | 232 | 233 | 234 | 235 | 236 | 237 | 238 | 239 |
| | 240 | 241 | 242 | 243 | 244 | 245 | 246 | 247 | 248 | 249 | 250 | 251 | 252 | 253 | 254 | 255 |

FIG. 8

| 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|
| 16 | 17 | 18 | 19 | 20 | 21 | 22 | 23 | 24 | 25 | 26 | 27 | 28 | 29 | 30 | 31 |
| 32 | 33 | 34 | 35 | 36 | 37 | 38 | 39 | 40 | 41 | 42 | 43 | 44 | 45 | 46 | 47 |
| 48 | 49 | 50 | 51 | 52 | 53 | 54 | 55 | 56 | 57 | 58 | 59 | 60 | 61 | 62 | 63 |
| 64 | 65 | 66 | 67 | 68 | 69 | 70 | 71 | 72 | 73 | 74 | 75 | 76 | 77 | 78 | 79 |
| 80 | 81 | 82 | 83 | 84 | 85 | 86 | 87 | 88 | 89 | 90 | 91 | 92 | 93 | 94 | 95 |
| 96 | 97 | 98 | 99 | 100 | 101 | 102 | 103 | 104 | 105 | 106 | 107 | 108 | 109 | 110 | 111 |
| 112 | 113 | 114 | 115 | 116 | 117 | 118 | 119 | 120 | 121 | 122 | 123 | 124 | 125 | 126 | 127 |
| 128 | 129 | 130 | 131 | 132 | 133 | 134 | 135 | 136 | 137 | 138 | 139 | 140 | 141 | 142 | 143 |
| 144 | 145 | 146 | 147 | 148 | 149 | 150 | 151 | 152 | 153 | 154 | 155 | 156 | 157 | 158 | 159 |
| 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 |
| 192 | 193 | 194 | 195 | 196 | 197 | 198 | 199 | 200 | 201 | 202 | 203 | 204 | 205 | 206 | 207 |
| 208 | 209 | 210 | 211 | 212 | 213 | 214 | 215 | 216 | 217 | 218 | 219 | 220 | 221 | 222 | 223 |
| 224 | 225 | 226 | 227 | 228 | 229 | 230 | 231 | 232 | 233 | 234 | 235 | 236 | 237 | 238 | 239 |
| 240 | 241 | 242 | 243 | 244 | 245 | 246 | 247 | 248 | 249 | 250 | 251 | 252 | 253 | 254 | 255 |

FIG. 11

|   | 0 | 1 | 2 | ... | ... | ... | ... | ... | 31 |
|---|---|---|---|---|---|---|---|---|---|
| 0 | 0 | 1 | 2 | ... | ... | ... | ... | ... | 31 |
| 1 | 1920 | 1921 | 1922 | ... | ... | ... | ... | ... | 1951 |
| 2 | 3840 | 3841 | 3842 | ... | ... | ... | ... | ... | 3871 |
| ... | ... | ... | ... | ... | ... | ... | ... | ... | ... |
| 15 | 28800 | 28801 | 28802 | ... | ... | ... | ... | ... | 28831 |

FIG. 12

|   | 0 | 1 | 2 | ... | ... | 15 |
|---|---|---|---|-----|-----|-----|
| 0 | 0 | 1 | 2 | ... | ... | 15 |
| 1 | 1920 | 1921 | 1922 | ... | ... | 1935 |
| 2 | 3840 | 3841 | 3842 | ... | ... | 3855 |
| ... | ... | ... | ... | ... | ... | ... |
| ... | ... | ... | ... | ... | ... | ... |
| ... | ... | ... | ... | ... | ... | ... |
| 31 | 59520 | 59521 | 59520 | ... | ... | 59535 |

DYNAMIC BUFFER PAGES

RELATED APPLICATIONS

This application claims the benefit of U.S. Provisional Application No. 60/269,784 filed Feb. 15, 2001, of U.S. Provisional Application No. 60/269,783 filed Feb. 15, 2001, and U.S. Provisional Application No. 60/324,498 filed Sep. 24, 2001, the disclosures of which are incorporated herein by reference.

This application is related to the following co-pending and commonly assigned patent applications: application Ser. No. 09/908,295 (filed on Jul. 17, 2001); application Ser. No. 09/907,852 (filed on Jul. 17, 2001); application Ser. No. 09/907,854 (filed on Jul. 17, 2001); application Ser. No. 09/908,301 (filed on Jul. 17, 2001); application Ser. No. 10/051,538, filed Jan. 16, 2002; application Ser. No. 10/051,680, filed Jan. 16, 2002; application Ser. No. 10/052,074, filed Jan. 16, 2002; and application Ser. Ser. No. 10/051,541, filed Jan. 16, 2002, the disclosures of which are incorporated herein by reference.

BACKGROUND

The present invention is related to video data storage. More particularly, the present invention is related to video display systems and frame buffers. Several related technologies are discussed below (in labeled sections for clarity).

1. Raster Scan Displays

A common type of graphics monitor is a conventional raster-scan display using a cathode ray tube ("CRT"). As is well known, in a typical CRT, an electron beam strikes phosphor on the inner surface of the screen producing light visible on the outer surface of the screen. By controlling the electron beam different locations of the screen can be struck, creating a pattern and hence a video image. In a typical CRT raster-scan display, the screen area is divided into a grid of pixels (or picture elements). The electron beam sweeps from left to right across the screen, one row at a time from top to bottom, progressively drawing each pixel on the screen. Each row of pixels is commonly referred to as a scan line. In this type of conventional display, the scan lines are horizontal. The number of pixels in a single scan line is referred to as the width. One complete pass over the screen and the pixels in that pass are commonly referred to as a frame. As the electron beam moves across the pixels of each scan line, the beam intensity can be adjusted to vary the light produced by the screen phosphor corresponding to the pixels. The light emitted by the phosphor of the pixels creates a pattern of illuminated spots forming the video image. The intensity of the electron beam is controlled by image data stored in a section of memory called the frame buffer or refresh buffer.

2. Grating Light Valves

Another type of display system uses one or more grating light valves ("GLV") to produce an image. GLV's are known devices, and a description can be found in (among other sources) a paper by D. M. Bloom of Silicon Light Machines, Inc., titled "The Grating Light Valve: revolutionizing display technology" (1997; available from Silicon Light Machines; and a copy of which has been filed in an Information Disclosure Statement for this application), and in an article (and therein cited references) by R. W. Corrigan and others of Silicon Light Machines, Inc., titled "An Alternative Architecture for High Performance Display" (presented at the 141$^{st}$ SMPTE Technical Conference and Exhibition, Nov. 20, 1999, in New York, N.Y.), the disclosures of which are incorporated herein by reference. In overview, a GLV uses a combination of reflection and diffraction of light to create an image. A GLV includes a one-dimensional array of GLV pixels, each GLV pixel including a number of microscopic "ribbons." The ribbons for each GLV pixel can be deflected through electrostatic force to create an adjustable diffraction grating. In a non-deflected state, the ribbons reflect light. As the ribbons are deflected, the ribbons increasingly diffract light. Accordingly, by controlling the ribbons, the proportion of light that is either reflected or diffracted can be controlled for each GLV pixel. The GLV deflects the ribbons for each GLV pixel according to image data, such as pixel data received from a frame buffer.

An array of GLV pixels can create a column of visible pixels, such as 1088 pixels, typically an entire column at a time. A GLV can be used to create a vertical column of pixels in a high definition resolution image, such as a screen resolution of 1920 pixels horizontally by 1080 pixels vertically (with some of the 1088 pixels left blank or dark). By providing a GLV with pixel data representing columns of pixels in a frame, the GLV can create the frame of pixels, one column at a time, sweeping from left to right. The location of each column of pixels can be controlled external to the GLV array, such as through lenses and an adjustable mirror, rather than moving the GLV itself. A combination of three GLV's for red, green, and blue can be used to produce a color image.

3. Frame Buffers

FIG. 1A is a representation of a screen 105 as a grid of pixels 110. In FIG. 1A, for simplicity, screen 105 is only 4×4 and so only 16 pixels are shown, but a typical screen has many more pixels. One common screen resolution is high definition ("HD") resolution, where screen resolution indicates the number of pixels in a frame and is typically given as the horizontal resolution (number of pixels in one row) versus the vertical resolution (number of pixels in one column). HD resolution is either 1920×1080 (2,073,600 total pixels per frame) or 1280×720 (921,600 pixels per frame). Herein, HD resolution refers to 1920×1080.

Returning to FIG. 1A, the pixels 110 are often numbered sequentially for reference. Pixel 0 is typically at the upper left. FIG. 1B is a representation of a memory device 150 implementing a frame buffer as a grid of memory locations 155. Typical memory devices include SDRAM (synchronous dynamic random access memory). The actual memory device used may vary in different devices, but the memory locations for the frame buffer are typically in a contiguous block of locations with sequential addresses. Memory device 150 has a memory location 155 for storing pixel data (e.g., an intensity value) for each pixel 110 of screen 105. In some implementations, pixel data for more than one pixel is stored at each memory location. In many conventional raster-scan systems, pixel data is stored in memory locations adjacent to one another in the same pattern as the pixels on the screen. In FIG. 1B, each memory location 155 is numbered with the number of the pixel (110 from FIG. 1A) corresponding to the pixel data stored in that memory location 155. For example, the pixel at the upper left of the screen is pixel 0 in FIG. 1A and pixel data for pixel 0 is stored in the first memory location in memory device 150, as indicated by the "0" in the upper left memory location 155. The second memory location stores pixel data for pixel 1, the fifth memory location stores pixel data for pixel 4, and so on.

4. Pixel Rates

FIG. 2 is a representation of screen resolutions and typical data throughput requirements. FIG. 2 shows four resolutions in respective areas: VGA resolution (640×480) 205, XGA resolution (1024×768) 210, SXGA resolution (1280×1024) 215, and HD resolution (1920×1080) 220. The pixel rate for a screen resolution is the number of pixels per second that need to be processed to maintain the screen resolution at a specified refresh rate (i.e., the number of times a complete frame is drawn to the screen per second). While pixel rates vary among implementations, the pixel rates shown in FIG. 2 are representative. These pixel rates are given in megapixels per second ("MP/S"). For example, according to SMPTE 274M-1998 (a specification defining, among other things, pixel rates for resolutions of 1920×1080), for HD resolution 220 the pixel rate is about 150 MP/S @60 Hz. FIG. 2 also shows a corresponding approximate data rate in megabytes per second ("MB/S") for each resolution. The data rate is the number of bytes per second to be processed based on the number of bytes per pixel and the pixel rate. For example, HD resolution 220 has a data rate of 450 MB/S, at 24 bits per pixel (3 bytes). If each pixel has 32 bits of data, the data rate for HD resolution is 600 MB/S. However, the data rate of a typical 32-bit wide SDRAM running at 125 MHz is approximately 500 MB/S. A frame buffer architecture using two 125 MHz SDRAM's can realize a data rate of approximately 1000 MB/S. Alternatively, a faster SDRAM, such as one running at 150 MHz, can meet 600 MB/S.

5. Frame Buffers Using Parallel Storage in Two Memory Devices

FIG. 3A is a representation of a frame 305 of pixels 310 divided between two memory devices. Frame 305 has only 32 pixels for simplicity, but, as noted above, a typical HD resolution frame has 2,073,600 pixels. FIG. 3B is a representation of a first memory device 350 and FIG. 3C is a representation of a second memory device 375. Each pixel 310 in frame 305 is numbered, starting with pixel 0 in the upper left of frame 305. Even-numbered pixels are stored in first memory device 350 and odd-numbered pixels are stored in second memory device 375. The pixels stored in second memory device 375 are also shaded for clarity in FIGS. 3A and 3C.

FIG. 4 is a block diagram of a typical frame buffer architecture 400 capable of accessing pixel data for two pixels in parallel, supporting the representations shown in FIGS. 3A, 3B, and 3C. For example, frame buffer architecture 400 can be used in a typical scan converter. A video source 405 provides pixel data to a first memory 410 (recall first memory device 350 in FIG. 3B) and to a second memory 415 (recall second memory device 375 in FIG. 3C) in parallel and a video destination 420 retrieves pixel data from first memory 410 and from second memory 415 in parallel. In this implementation, pixel data for each pixel is stored in a separate addressable memory location. Video source 405 receives video data from another source (not shown), such as a broadcast source or a software application running on a computer system connected to video source 405. Video destination 420 controls the display of each pixel on a video device (not shown), such as a CRT. First memory 410 and second memory 415 are separate memory devices such as two SDRAM's. A first data bus 425 is connected to video source 405, first memory 410, and video destination 420. A second data bus 430 is connected to video source 405, second memory 415, and video destination 420. A source address bus 435 is connected to video source 405 and a first input 440 of an address multiplexor 445. A destination address bus 450 is connected to video destination 420 and a second input 455 of address multiplexor 445. An output 460 of address multiplexor 445 is connected to first memory 410 and second memory 415. Accordingly, the same address is provided to both first memory 410 and second memory 415. Address multiplexor 445 receives a control signal (not shown) to cause first input 440 or second input 455 to connect to output 460. First memory 410 and second memory 415 also receive control signals (not shown) to control whether memories 410 and 415 will read in data (write mode) or read out data (read mode). In addition, while clock lines are not shown in FIG. 4, architecture 400 operates based on clock cycles so that pixel data can be processed for two pixels per clock cycle in support of the desired pixel rate.

In operation, memories 410 and 415 read in or store complementary halves of a frame of pixels as pixel data from video source 405 and output the pixel data to video destination 420. To store pixel data, memories 410 and 415 are put in write mode and address multiplexor 445 is set to connect first input 440 to output 460. Video source 405 provides pixel data for a first pixel to first data bus 425, such as pixel 0 in FIG. 3A, and pixel data for a second pixel to second data bus 430, such as pixel 1 in FIG. 3A. First data bus 425 provides its pixel data to first memory 410 and second data bus 430 provides its pixel data to second memory 415. Video source 405 also provides an address to source address bus 435. To calculate the address, video source 405 can use a counter. Because each memory 410 and 415 stores pixel data for half the pixels in one frame, the counter typically ranges from 0 to one less than one-half of the number of pixels in one frame. Video source 405 can increment the counter by 1 for each pixel pair. Source address bus 435 provides the address to first input 440 of address multiplexor 445. Address multiplexor 445 in turn provides the address to first memory 410 and second memory 415. First memory 410 stores the pixel data on first data bus 425 at the address supplied by address multiplexor 445 from video source 405. Second memory 415 stores the pixel data on second data bus 430 at the same address. Two pixels have been stored in parallel in two memories using the same address. Referring to FIGS. 3A, 3B, and 3C, pixel 0 and pixel 1 are stored at the same time at the same address in first memory device 350 and second memory device 375, respectively. Accordingly, for example, pixel 0 is at address 0 in first memory device 350, pixel 1 is at address 0 in second memory device 375, pixel 2 is at address 1 in first memory device 350, pixel 3 is at address 1 in second memory device 375, and so on.

To retrieve pixel data, memories 410 and 415 are put in read mode and address multiplexor 445 is set to connect second input 455 to output 460. Video destination 420 provides an address to destination address bus 450. Destination address bus 450 provides the address to second input 455 of address multiplexor 445. Address multiplexor 445 in turn provides the address to first memory 410 and second memory 415. First memory 410 provides the pixel data stored at the address supplied by address multiplexor 445 from video destination 415 to first data bus 425. Second memory 415 provides the pixel data stored at the same address to second data bus 430. First data bus 425 provides its pixel data to video destination 420 and second data bus 430 provides its pixel data to video destination 420. Two pixels have been retrieved in parallel from two memories using the same address. Referring to FIGS. 3A, 3B, and 3C, pixel 0 and pixel 1 can be retrieved at the same time using the same address from first memory device 350 and second memory device 375, respectively.

FIG. 5 is a block diagram of another implementation of a dual pixel frame buffer architecture 500. Architecture 500 is similar to architecture 400 of FIG. 4, but a memory controller 545 provides data and addresses to memories 510 and 515. Memory controller 545 receives pixel data from video source 505 to store in memories 510 and 515. Memory controller 545 retrieves pixel data from memories 510 and 515 and provides the pixel data to video destination 520. Memory controller 545 replaces address multiplexor 445. Memory controller 545 receives signals from video source 505 and video destination 520 indicating whether pixel data is to be stored to or retrieved from memories 510 and 515. Memory controller 545 generates addresses and supplies these addresses along with control signals to memories 510 and 515. Accordingly, memory controller 545 controls address generation rather than video source 505 and video destination 520, as compared with architecture 400 of FIG. 4. In addition, as noted above with respect to FIG. 4, architecture 500 operates based on clock cycles so that pixel data can be processed for two pixels per clock cycle in support of the desired pixel rate.

6. Double-buffering

Typical frame buffer architectures often also utilize "double-buffering." Double-buffering is a well known technique where the memory address space of a frame buffer is divided into two sections. In some architectures, each section is a separate memory device, and in other architectures one or more devices are each divided into sections. Data from a frame is stored in one section while data from a previously stored frame is read from the other section. Series of reading and writing operations alternate. For example, after storing pixel data for 16 pixels, pixel data for 16 pixels is retrieved. After storing a frame, the sections switch roles. Pixel data for blocks of pixels can be temporarily stored before being sent to memory or after being received from memory in a buffer, such as a FIFO buffer. In architectures 400 and 500 from FIGS. 4 and 5, respectively, FIFO buffers can be included in both the video source and the video destination, or in the memory controller.

7. SDRAM

Various types of memory devices can be used in implementing a frame buffer. One common type of memory used is SDRAM (synchronous dynamic random access memory). The structure and operation of SDRAM is well known. In overview, an SDRAM has a number of addressable memory locations that depends on the total size of the SDRAM and the size of each memory location. Each addressable memory location has a corresponding memory address. For example, an 8 MB (megabyte) SDRAM where each location is 32 bits has 2,097,152 addressable locations, while an 8 MB SDRAM were each location is 8 bits has four times as many addressable locations. FIG. 6A is a representation of 2,097,152 memory locations as a one-dimensional array 605. Memory cells in a typical SDRAM are physically arranged in a two-dimensional grid and so individual cells can be identified using a combination of a row number and a column number. The memory locations within the same row are often collectively referred to as a "page." FIG. 6B is a representation of 2,097,152 memory locations as a two-dimensional array or grid 650 having X columns and Y rows. In FIG. 6B, grid 650 has 256 columns 655, from 0 to X−1, and 8192 rows or pages 660, from 0 to Y−1. Accordingly, the location in row y at column x has address (y*X+x). For example, location 665 (the first location in the last page) has address (X*(Y−1)) and location 670 (the last location in the last page) has address (X*Y−1). The sizes of the boxes representing locations in FIG. 6C are representative and not to scale, so different size boxes are not different size memory locations (e.g., locations 665 and 670).

An address for a memory cell can be viewed as a combination of a row address and a column address. FIG. 6C is a representation of an address 675 for one memory location out of 2,097,152. Address 675 has 21 bits, with A0 as the lowest order bit. The lower 8 bits, A0 to A7, are a column address 680, ranging from 0 to 255. The upper 13 bits, A8 to A20, are a row or page address 685, ranging from 0 to 8191.

Due to the nature of the construction of SDRAM, an entire page of memory cells is active at a time. Accessing cells within the same page can be accomplished relatively quickly using a series of column addresses without changing the page address. To change pages, a new page address is used and an additional delay is incurred from both the extra address cycle and a delay in the memory changing which page is active. This delay is referred to as a "page miss" and can result in a loss in speed. SRAM (static random access memory) typically does not incur the same page miss delay as SDRAM, but SRAM is typically more expensive than SDRAM.

In a conventional frame buffer using SDRAM, pixel data for horizontally neighboring pixels is typically stored in the same page of memory. Referring to FIGS. 1A and 1B, pixel data for pixels 0, 1, 2, and 3 would be stored in one page, pixel data for pixels 4, 5, 6, and 7 would be stored in another page, and so on. In a parallel architecture, such as architecture 400 in FIG. 4, a page stores pixel data for every other horizontally aligned pixel, such as the first page of memory device 350 storing pixel data for pixels 0, 2, 4, and 6 in FIGS. 3A and 3B. Storing and retrieving pixel data can be accomplished quickly with few page misses because pixel data in a conventional raster scan system is processed in row order (left to right, top to bottom) for both storing and retrieving. The pixel data for pixels in different rows are typically not stored in the same page, and so page misses occur when pixel data is to be stored or retrieved for pixels from different rows. For example, retrieving pixel data for pixels 0, 1, 2, and 3 would cause one page miss (the initial page miss in the first access), but retrieving pixel data for pixels 0, 4, 8, and 12 would cause four page misses.

SUMMARY

The present disclosure provides methods and apparatus for adjusting the geometry of buffer pages. In one implementation, a buffer page system includes: a data source, providing data elements in a first order; a data destination, receiving data elements in a second order, where each data element corresponds to an entry in one of a plurality of buffer pages, each buffer page having a plurality of entries along a first dimension corresponding to the first order and a plurality of entries along a second dimension corresponding to the second order; at least one memory device, each memory device having a plurality of memory pages including a plurality of memory locations, each memory location having an address, where data elements are stored to each memory device in the first order and retrieved from each memory device in the second order, and where each memory page stores data elements in multiple locations according to the first order and stores data elements in multiple locations according to the second order; and a buffer page controller, where the buffer page controller controls the geometry of each buffer page.

In another implementation, a method of controlling pixel page geometry includes: determining one or more criteria for controlling pixel page geometry; determining a screen resolution of a frame of pixels; determining a number of memory locations available in a page of memory, where a page of memory corresponds to a pixel page; and selecting a pixel page geometry based on the one or more criteria, the screen resolution, and the number of memory locations available in a page of memory.

BRIEF DESCRIPTION OF THE DRAWINGS

FIG. 3A is a representation of a frame of pixels divided between two memory devices.

FIG. 3B is a representation of a first memory device.

FIG. 3C is a representation of a second memory device.

FIG. 7 is a representation of a frame of pixels according to the present invention.

FIG. 8 is a representation of a frame of pixels according to the present invention.

FIG. 11 is a representation of one implementation of a pixel page of pixels in an HD resolution implementation using two memory devices according to the present invention.

FIG. 12 is a representation of one implementation of a pixel page of pixels in an HD resolution implementation using two memory devices according to the present invention.

DETAILED DESCRIPTION

Figure 1A:
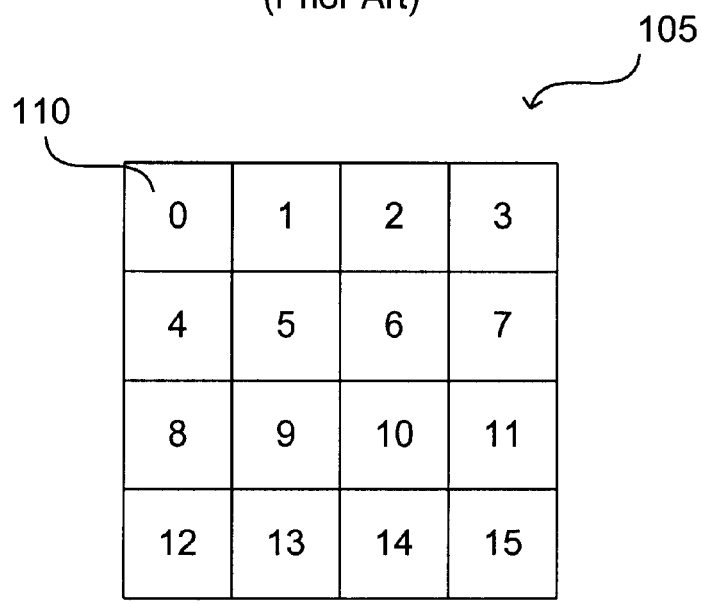
FIG. 1A is a representation of a screen as a grid of pixels.
Figure 1B:
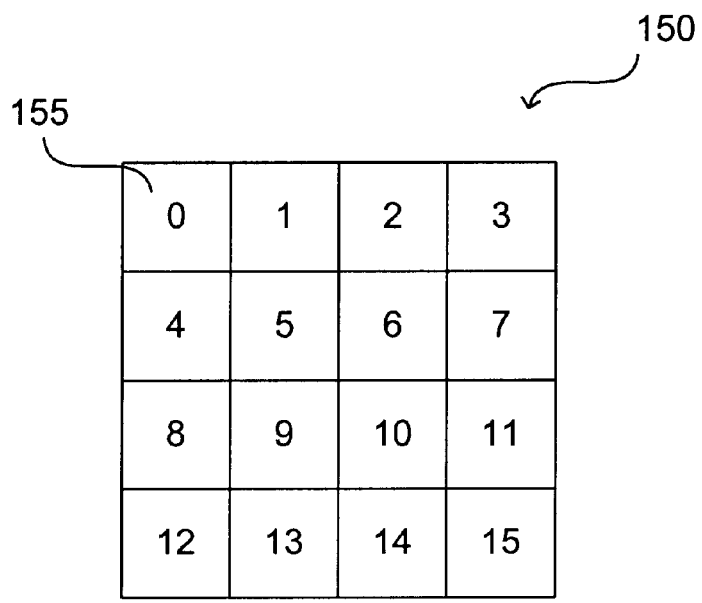
FIG. 1B is a representation of a memory device implementing a frame buffer as a grid of memory locations.
Figure 2:
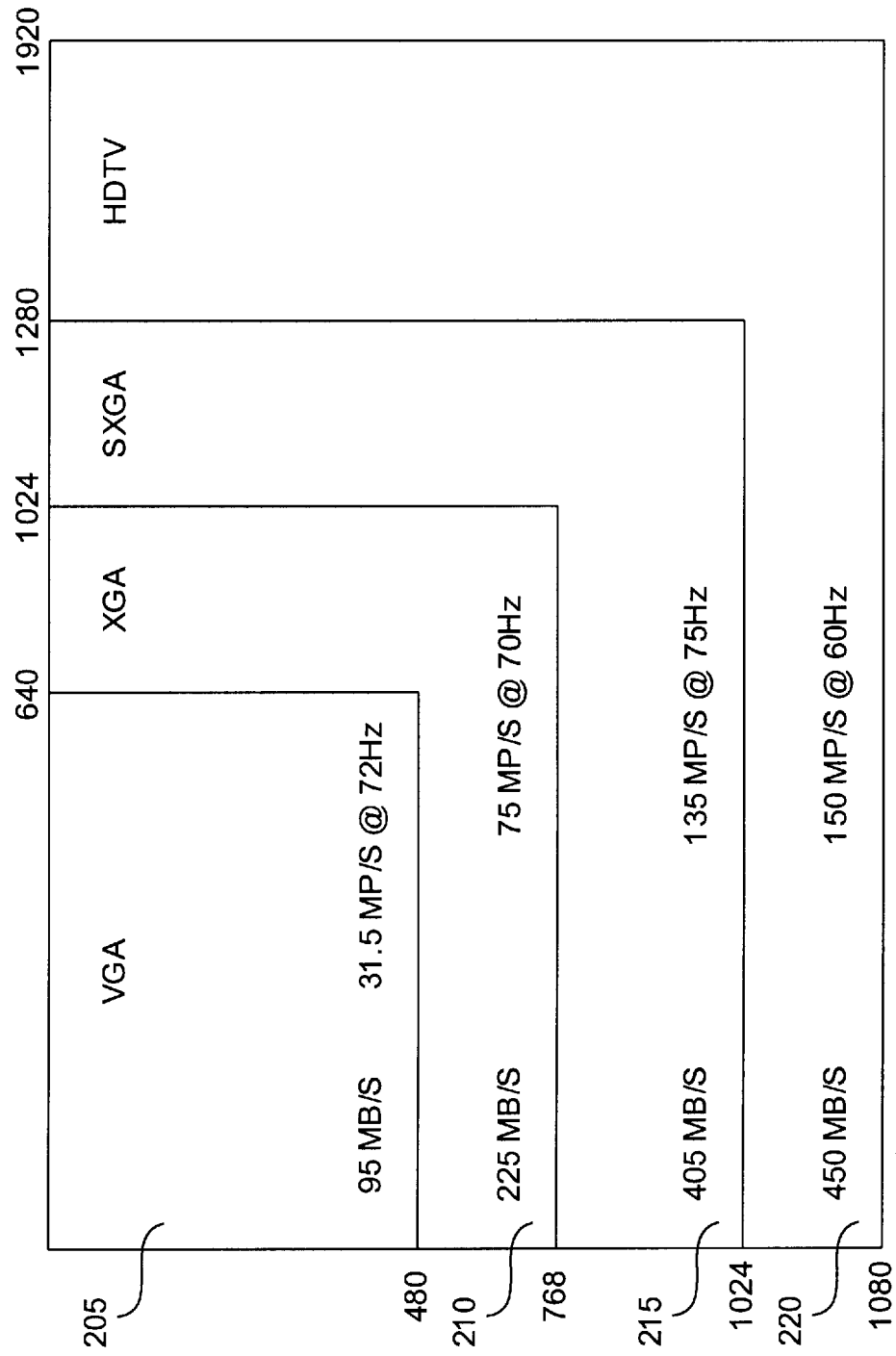
FIG. 2 is a representation of screen resolutions and typical data throughput requirements.

The present invention provides methods and apparatus for dynamically adjusting the geometry of buffer pages. As described in the related application Ser. No. 10/051,538, filed Jan. 16, 2002 (Attorney Docket No. 71743), a buffer page is a two-dimensional array of data elements. The two-dimensional arrays form a buffer referred to herein as buffer pages. Data corresponding to a buffer page is stored in a first order following the first dimension of the buffer page and retrieved in a second order following the second dimension. The memory locations within a memory device corresponding to one buffer page are in the same physical memory page. The buffer page represents a memory mapping of data to memory locations. In one implementation, the buffer pages are for storing pixel data and these buffer pages are referred to as "pixel pages." A pixel page maps pixel data to memory locations for a region of pixels from multiple rows and columns of pixels. Pixel data is stored according to horizontal rows of pixels and retrieved according to vertical columns of pixels. While the description herein focuses on pixel pages and pixel data storage, the invention is applicable to other applications as well.

A. Pixel Pages and Pixel Page Geometry

In implementations using video data and pixel pages, the pixel pages are used in a frame buffer for storing pixel data. Pixel data is supplied to the frame buffer according to the horizontal order of pixels in a frame, such as from left to right, top to bottom. Pixel data is provided by the frame buffer according to the vertical order of pixels in a frame, such as from top to bottom, left to right. Pixel pages are configured to support storing and retrieving pixel data in these two different orders. In an alternative implementation, pixel data is stored according to vertical columns of pixels and retrieved according to horizontal rows of pixels.

Each pixel page is a two-dimensional mapping of pixels and pixel data to memory locations, aligning rows and columns within the pixel page with rows and columns in the frame of pixels. One dimension of the pixel page, referred to as pixel page rows, corresponds to horizontal rows of pixels in the frame, referred to as frame rows. A second dimension of the pixel page, referred to as pixel page columns, corresponds to vertical columns of pixels in the frame, referred to as frame columns. A pixel page has multiple pixel page rows and multiple pixel page columns. Each pixel page indicates memory locations from a single physical memory page so that consecutive accesses to locations from a single pixel page do not cause page misses. Accordingly, accessing consecutive locations corresponding to a pixel page along a pixel page row or along a pixel page column do not cause page misses. Page misses can occur at the end of a pixel page row or pixel page column in making a transition to another pixel page. By storing pixel data along pixel page rows and retrieving data along pixel page columns, page misses can be reduced in processing pixel data that is to be stored in one order and retrieved in another order.

FIG. 7 is a representation of a frame 705 of pixels 710. Frame 705 has 16 frame columns and 16 frame rows (16×16; 256 pixels) for simplicity, but other resolutions are possible. For example, as noted above, a frame in one typical HD resolution is 1920×1080 (2,073,600 pixels). Pixels 710 in frame 705 are sequentially numbered from 0 to 255. Frame 705 is divided into pixel pages 715, outlined in heavier lines. Each pixel page 715 includes 16 pixels 710, in four pixel page columns 720 and four pixel page rows 725. Accordingly, a pixel page column 720 includes four pixels 710, and a pixel page row 725 includes four pixels 710. For example, pixels 0, 16, 32, and 48 are in one pixel page column 720 and pixels 0, 1, 2, and 3 are in one pixel page row 725. Frame 705 has 16 pixel pages 715, four horizontally by four vertically. Pixel data for each pixel page 715 is stored in a respective page of physical memory. For frame 705, the first page of memory stores pixel data for the pixel page 715 including pixels 0, 1, 2, 3, 16, 17, 18, 19, 32, 33, 34, 35, 48, 49, 50, and 51. The second page of memory stores pixel data for the pixel page 715 including pixels 4, 5, 6, 7, 20, 21, 22, 23, 36, 37, 38, 39, 52, 53, 54, 55, and so on.

In storing pixel data for frame 705, pixel data is stored for pixels 710 in horizontal row order (left to right, top to bottom): 0, 1, 2, 3, 4, and so on. Pixel data is stored following the pixel page rows 725 of pixel pages 715 (e.g., horizontally). A page miss occurs at the boundary of each pixel page 715, at the end of a pixel page row 725 (as described below, some page misses can be hidden using burst accessing, depending on the type of memory device). Because pixel pages 715 are four pixels 710 wide, a page miss would occur storing pixel data for every four pixels 710, i.e., storing pixel data for pixel 0, for pixel 4, pixel 8, etc. Storing one frame 705 of pixel data would cause a total of 64 page misses (4*16).

In retrieving pixel data for frame 705, pixel data is retrieved for pixels 710 in vertical column order (top to bottom, left to right): 0, 16, 32, 48, 64, and so on. Pixel data is retrieved following the pixel page columns 720 of the pixel pages 715 (e.g., vertically). A page miss occurs at the end of each pixel page column 720. Because pixel pages 715 are four pixels 710 tall, a boundary of a pixel page 715 occurs vertically every four pixels 710. Accordingly, a page miss would occur retrieving pixel data for every four pixels 710, i.e., retrieving pixel data for pixel 0, for pixel 64, for pixel 128, etc. Retrieving one frame 705 of pixel data would cause a total of 64 page misses (4*16).

The total page misses in processing one frame 705 using pixel pages 715 would be 128. By comparison, if pixel data were stored corresponding to horizontal frame rows of pixels, i.e., pixel data for pixels 0–15 were stored in the same memory page, a page miss would occur every 16 pixels for storing pixel data and every pixel for retrieving pixel data. Storing one frame would cause 16 page misses (1*16) and retrieving one frame would case 256 page misses (16*16). The total page misses in processing one frame would be 272. Accordingly, pixel pages can provide a significant speed improvement without changing the physical memory device.

As described above, a pixel page has a geometry, defined by the number of pixels in each pixel page row and pixel page column. For example, pixel pages 715 in FIG. 7 have a geometry of 4×4. For a particular application, one factor influencing the pixel page geometry is the size of the memory page corresponding to the pixel page. Where efficiency of memory use (i.e., avoiding unused memory locations) is desirable, a pixel page geometry that uses all of the memory locations in the corresponding memory page is advantageous. For example, if a memory page has 256 memory locations, a pixel page geometry of 16×16 uses all of the memory locations in the corresponding memory page because this pixel page includes 256 pixels. However, a pixel page geometry of 20×10 does not use all of the memory locations because the pixel page includes only 200 pixels.

Another factor is the number of memory devices being accessed in parallel. Where pixel data is stored to two memory devices in parallel, half of the pixel data for each pixel page is stored in one memory device and half in the second memory device. As a result, the number of pixels in a pixel page can double because two memory pages (one in each memory device) are used for each pixel page. For example, if a memory page has 256 memory locations, a pixel page geometry of 16×16 does not use all the memory locations in the two memory pages corresponding to the pixel page, but a pixel page geometry of 32×16 does (512 pixels corresponding to 256 memory locations in each memory page).

Different pixel page geometries have different effects. As described above, some pixel page geometries may not use all the memory locations in each memory page. This waste of memory locations may not be desirable where memory efficiency is important.

Another effect of pixel page geometries is the number of page misses which occur while storing and retrieving pixel data. The pixel page geometry of the pixel pages used for a frame of pixels determines the number of pixel pages allocated vertically and horizontally in the frame. As described above, a page miss occurs at the boundary of each pixel page and so allocating more pixel pages creates more page misses. Several examples illustrate this difference below.

As described above referring to FIG. 7, in a frame 705 of 256 pixels (16×16), a pixel page geometry of 4×4 causes 128 page misses, 64 while storing pixel data and 64 while retrieving pixel data. Four pixel pages are allocated horizontally and so four page misses occur while storing pixel data for each row of pixels. Frame 705 has 16 rows of pixels. Accordingly 64 page misses occur while storing pixel data. Similarly, four page misses occur while retrieving pixel data for each column of pixels and so 64 page misses occur while retrieving pixel data.

FIG. 8 is a representation of a frame 805 of pixels 810. Similar to FIG. 7, frame 805 has 16 frame columns and 16 frame rows (16×16; 256 pixels). Frame 805 is divided into 16 pixel pages 815, outlined in heavier lines. Accordingly, pixel data for frame 805 is stored in 16 memory pages.

Each pixel page 815 includes 16 pixels 810 and has a pixel page geometry of 8×2, eight pixel page columns 820 and two pixel page rows 825. Accordingly, a pixel page column 820 includes two pixels 810, and a pixel page row 825 includes eight pixels 810. In storing pixel data for frame 805, because pixel pages 815 are eight pixels 810 wide, a page miss would occur storing pixel data for every eight pixels 810. Storing one frame 805 of pixel data would cause a total of 32 page misses (2*16). In retrieving pixel data for frame 805, because pixel pages 815 are two pixels 810 tall, a page miss would occur retrieving pixel data for every two pixels 810. Retrieving one frame 805 of pixel data would cause a total of 128 page misses (8*16). In total, storing and retrieving one frame 805 of pixels using pixel pages 815 would cause 160 page misses.

Figure 9:
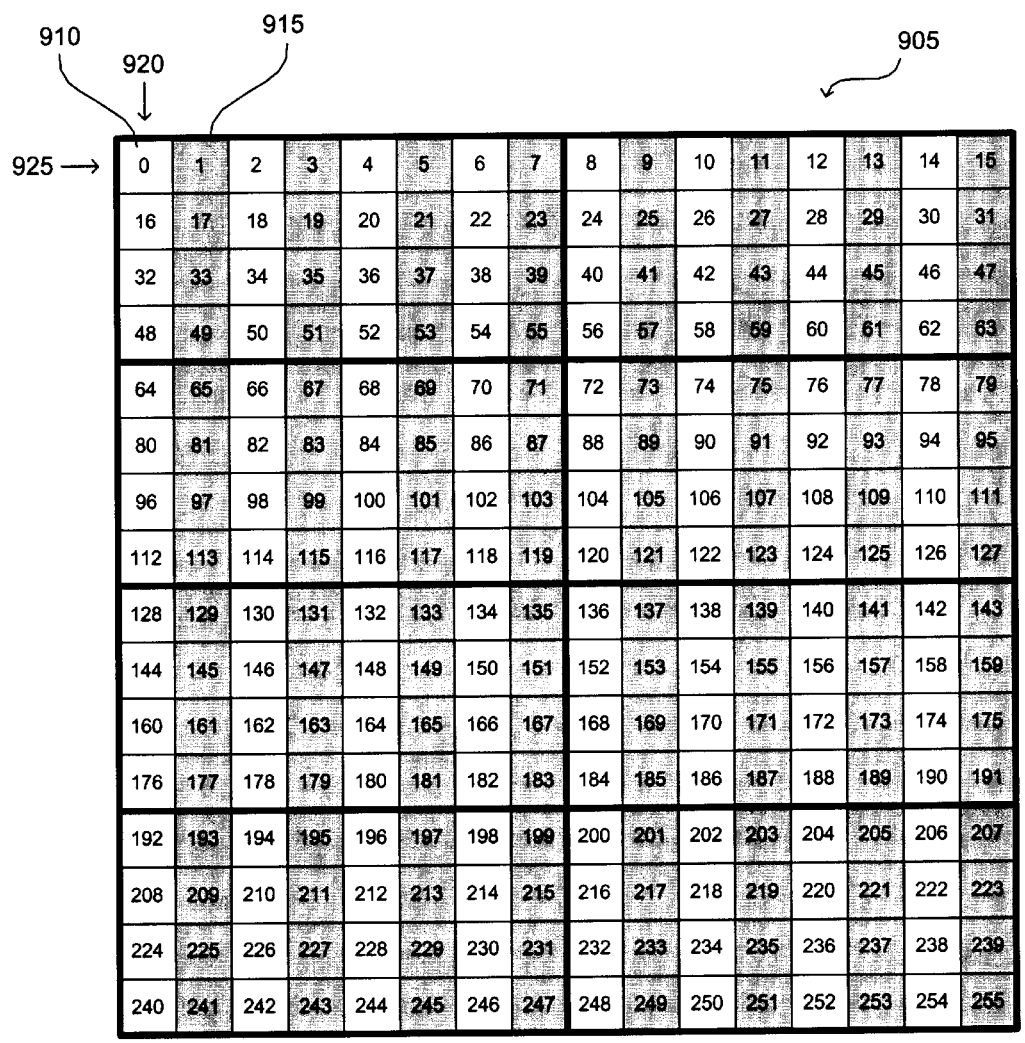
FIG. 9 is a representation of a frame of pixels according to the present invention.

FIG. 9 is a representation of a frame 905 of pixels 910. Similar to FIG. 7, frame 905 has 16 frame columns and 16 frame rows (16×16; 256 pixels). Frame 905 is divided into 8 pixel pages 915, outlined in heavier lines, stored in two memory devices. Pixel data for half of the pixels 910 is stored in a first memory device and pixel data for the other half of the pixels 910 is stored in a second memory device (the memory devices are not shown in FIG. 9). Similar to FIGS. 3A, 3B, and 3C, pixels having pixel data stored in the first memory device are indicated by unshaded boxes, such as even-numbered pixels (e.g., pixel 0), and pixels having pixel data stored in the second memory device are indicated by shaded boxes, such as odd-numbered pixels (e.g., pixel 1). Accordingly, pixel data for frame 905 is stored in 16 memory pages, eight in each memory device.

Each pixel page 915 includes 32 pixels 910 and has a pixel page geometry of 8×4, eight pixel page columns 920 and four pixel page rows 925. Accordingly, a pixel page column 920 includes four pixels 910, and a pixel page row 925 includes eight pixels 910. In storing pixel data for frame 905, because pixel pages 915 are eight pixels 910 wide, a page miss would occur storing pixel data for every eight pixels 910. Storing one frame 905 of pixel data would cause a total of 32 page misses (2*16). In retrieving pixel data for frame 905, because pixel pages 915 are four pixels 910 tall, a page miss would occur retrieving pixel data for every four pixels 910. Retrieving one frame 905 of pixel data would cause a total of 32 page misses (4*8; pixel data for two columns of pixels is retrieved in parallel). In total, storing and retrieving one frame 905 of pixels using pixel pages 915 would cause 64 page misses.

Figure 10:
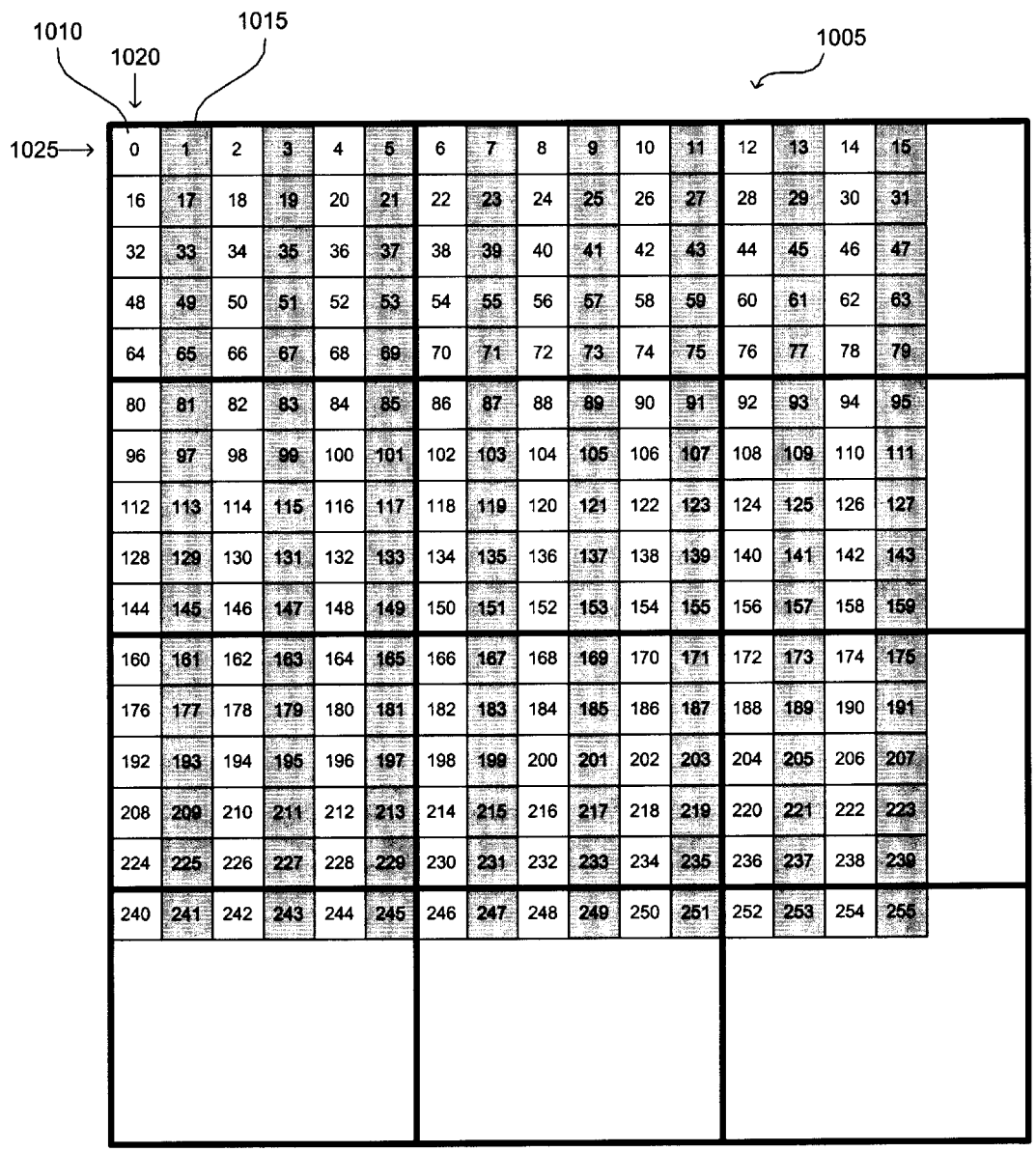
FIG. 10 is a representation of a frame of pixels according to the present invention.

FIG. 10 is a representation of a frame 1005 of pixels 1010. Similar to FIG. 7, frame 1005 has 16 frame columns and 16 frame rows (16×16; 256 pixels). Frame 1005 is divided into 12 pixel pages 1015, outlined in heavier lines, stored in two memory devices. Similar, to FIG. 9, pixel data for half of the pixels 1010 is stored in a first memory device and pixel data for the other half of the pixels 1010 is stored in a second memory device (the memory devices are not shown in FIG. 10), and boxes are shaded accordingly. Accordingly, pixel data for frame 1005 is stored in 24 memory pages, 12 in each memory device.

Each pixel page 1015 includes up to 30 pixels 1010 and has a pixel page geometry of 6×5, six pixel page columns 1020 and five pixel page rows 1025. Because this pixel page geometry does not evenly match the resolution of frame 1005, some pixel pages 1015 include less than 30 pixels. For example, the pixel page 1015 including pixel 12 includes only 20 pixels and the pixel page 1015 including pixel 240 includes only 6 pixels. Accordingly, a pixel page column 1020 includes up to five pixels 1010, and a pixel page row 1025 includes up to six pixels 1010. In storing pixel data for frame 1005, because pixel pages 1015 are six pixels 1010 wide, a page miss would occur storing pixel data for every six pixels 1010. Storing one frame 1005 of pixel data would cause a total of 48 page misses (3*16). In retrieving pixel data for frame 1005, because pixel pages 1015 are five pixels 1010 tall, a page miss would occur retrieving pixel data for every five pixels 1010. Retrieving one frame 1005 of pixel data would cause a total of 32 page misses (4*8; pixel data for two columns of pixels is retrieved in parallel). In total, storing and retrieving one frame 1005 of pixels using pixel pages 1015 would cause 80 page misses.

FIG. 11 is a representation of one implementation of a pixel page 1105 of pixels 1110 in an HD resolution implementation using two memory devices. Pixel page 1105 has a pixel page geometry of 32×16. Pixels 1110 in pixel page 1105 are numbered as the pixels 1110 would be numbered in the corresponding 1920×1080 frame for the first pixel page 1105. Similar to FIG. 9, unshaded boxes indicate pixels for which pixel data is stored in one memory device and shaded boxes indicate pixels for which pixel data is stored in the other memory device. Pixel page 1105 includes 512 pixels 1110, in 32 pixel page columns 1115 (numbered 0 to 31) and 16 pixel page rows 1120 (numbered 0 to 15). A pixel page column 1115 includes 16 pixels 1110 and a pixel page row 1120 includes 32 pixels 1110. For clarity, not every pixel 1110 of pixel page 1105 is shown in FIG. 11. Ellipses indicate intervening pixels 1110. 60 pixel pages are allocated horizontally (60*32=1920) and 68 pixel pages are allocated vertically (68*16>1080). Accordingly, pixel data for a 1920×1080 frame using pixel pages 1105 is stored in 8160 memory pages, 4080 in each memory device.

In storing pixel data for a 1920×1080 frame, because pixel pages 1105 are 32 pixels 1110 wide, a page miss would occur storing pixel data for every 32 pixels 1110. Storing one 1920×1080 frame of pixel data would cause a total of 64,800 page misses (60*1080). In retrieving pixel data for a 1920×1080 frame, because pixel pages 1105 are 16 pixels 1110 tall, a page miss would occur retrieving pixel data for every 16 pixels 1110. Retrieving one 1920×1080 frame of pixel data would cause a total of 65,280 page misses (68*960; pixel data for two columns of pixels is retrieved in parallel). In total, storing and retrieving one 1920×1080 frame of pixels using pixel pages 1105 would cause 130,080 page misses.

In another implementation, a pixel page in an HD resolution implementation using two memory devices has a pixel page geometry of 22×23. This 22×23 pixel page includes 506 pixels, in 22 pixel page columns and 23 pixel page rows. Similar to FIG. 10, because this 22×23 pixel page geometry does not evenly match the resolution of 1920×1080, some pixel pages include less than 506 pixels. A pixel page column includes up to 23 pixels and a pixel page row includes up to 22 pixels. 88 pixel pages are allocated horizontally (88*22>1920) and 47 pixel pages are allocated vertically (47*23>1080). Accordingly, pixel data for a 1920×1080 frame using 22×23 pixel pages is stored in 8272 memory pages, 4136 in each memory device.

In storing pixel data for a 1920×1080 frame, because the 22×23 pixel pages are 22 pixels wide, a page miss would occur storing pixel data for every 22 pixels. Storing one 1920×1080 frame of pixel data would cause a total of 95,040 page misses (88*1080). In retrieving pixel data for a 1920×1080 frame, because the 22×23 pixel pages are 23 pixels tall, a page miss would occur retrieving pixel data for every 23 pixels. Retrieving one 1920×1080 frame of pixel data would cause a total of 45,120 pages misses (47*960; pixel data for two columns of pixels is retrieved in parallel). In total, storing and retrieving one 1920×1080 frame of pixels using 22×23 pixel pages would cause 140,160 page misses.

FIG. 12 is a representation of one implementation of a pixel page 1205 of pixels 1210 in an HD resolution implementation using two memory devices. Pixel page 1205 has a pixel page geometry of 16×32. Similar to FIG. 11, pixels 1210 in pixel page 1205 are numbered as the pixels 1210 would be numbered in the corresponding 1920×1080 frame for the first pixel page 1205. Similar to FIG. 9, unshaded boxes indicate pixels for which pixel data is stored in one memory device and shaded boxes indicate pixels for which pixel data is stored in the other memory device. Pixel page 1205 includes 512 pixels 1210, in 16 pixel page columns 1215 (numbered 0 to 15) and 32 pixel page rows 1220 (numbered 0 to 31). A pixel page column 1215 includes 32 pixels 1210 and a pixel page row 1220 includes 16 pixels 1210. For clarity, not every pixel 1210 of pixel page 1205 is shown in FIG. 12. Ellipses indicate intervening pixels 1210. 120 pixel pages are allocated horizontally (120*16 1920) and 34 pixel pages are allocated vertically (34*32>1080). Accordingly, pixel data for a 1920×1080 frame using pixel pages 1205 is stored in 8160 memory pages, 4080 in each memory device.

In one implementation using pixel pages 1205, burst accessing or a burst mode is used to access a sequence of memory locations in a memory page. Burst accessing is a well known technique and is described more fully in application Ser. No. 10/051,538, filed Jan. 16, 2002 (Attorney Docket No. 71743). Burst accessing can be used to hide page misses by activating a memory page in a second memory bank while a burst access is being made to a memory page in a first memory bank. In storing pixel data according to horizontal rows for a 1920×1080 frame, because pixel pages 1205 are 16 pixels 1210 wide, the end of a pixel page 1205 occurs every 16 pixels 1210 horizontally. Using burst accessing and multiple memory banks, the page miss that would occur at the boundary of each pixel page can be hidden while storing pixel data. Accordingly, storing one 1920×1080 frame of pixel data would cause one effective page miss (i.e., a page miss that is not hidden and affects timing) in activating the first memory page. Storing pixel data for a sequence of frames would cause only one effective page miss at the start of the first frame. When using burst accessing the horizontal dimension of the pixel page geometry does not affect the number of effective page misses, so long as the pixel page is wide enough to allow burst accessing to be effective. Typically eight cycles is sufficient and so eight locations are used in each memory device resulting in a pixel page width of 16.

However, typical burst accessing would not help to hide page misses in retrieving pixel data (according to vertical column order) using pixel pages because the sequences of addresses generated using burst accessing are typically consecutive or tightly grouped. Conversely, the addresses needed for retrieving pixel data using pixel pages are not consecutive and may be spaced widely (e.g., 0, 16, 32, etc.). As a result, increasing the pixel page height can reduce the time lost to page misses while retrieving pixel data. In retrieving pixel data for a 1920×1080 frame, because pixel pages 1205 are 32 pixels 1210 tall, a page miss would occur retrieving pixel data for every 32 pixels 1210. Retrieving one 1920×1080 frame of pixel data would cause a total of 32,640 pages misses (34*960; pixel data for two columns of pixels is retrieved in parallel). In total, storing and retrieving one 1920×1080 frame of pixels using pixel pages 1205 would cause 32,640 effective page misses (the first frame in a sequence of frames has one more effective page miss for activating the first memory page). In an alternative implementation, pixel data is stored and retrieved to take advantage of burst accessing while retrieving pixel data.

As can be seen from the examples above, different pixel page geometries have different effects which may be desirable for different situations. In general, a symmetrical (or nearly symmetrical) pixel page provides a good result for reducing page misses, though this geometry may use more memory than a geometry that maximizes memory efficiency. When using burst accessing, a taller pixel page is typically more desirable. In another environment, pixel data is retrieved twice for each time data is stored and so a geometry that reduces page misses in retrieving data would be desirable. Accordingly, different conditions may point to different pixel page geometries as being desirable. The present invention provides a pixel page system that adjusts the pixel page geometry to the current conditions. This system can be used in multiple environments or can adjust to a changing environment (e.g., the screen resolution changes).

Figure 13:
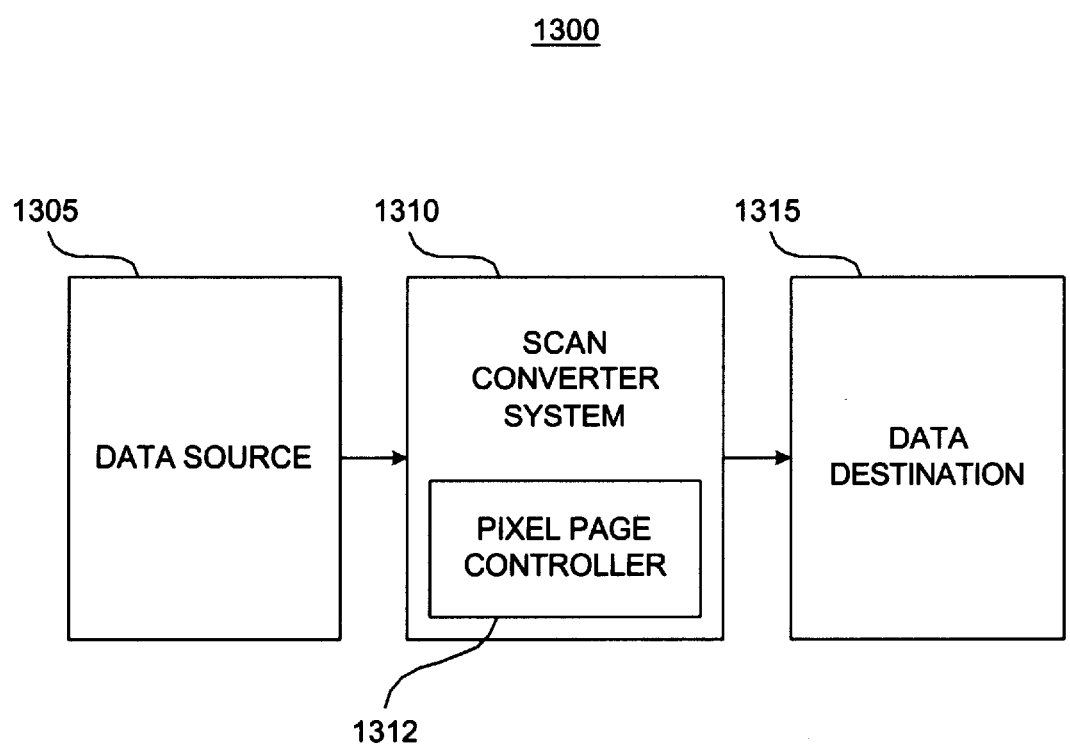
FIG. 13 is a block diagram of a video data system according to the present invention.

FIG. 13 is a block diagram of a video data system 1300. A data source 1305 provides video data for frames of pixels to a scan converter system 1310 in a first order. Scan converter system 1310 stores the data using pixel pages, as described above. Scan converter system 1310 includes a pixel page controller 1312. Pixel page controller 1312 sets the pixel page geometry for pixel pages used to store and retrieve data and determines the allocation of pixel pages to the frame. As described below, pixel page controller 1312 evaluates the resolution of video data provided by data source 1305. In an alternative implementation, data source 1305 instructs pixel page controller 1312 what pixel page geometry to use. Scan converter system 1310 retrieves the data in a second order and provides the retrieved data to a data destination 1315. For a video application, scan converter system 1310 can be used as a type of scan converter between data source 1305 and data destination 1315.

Data source 1305 is a video source providing pixel data to scan converter system 1310 and data destination 1315 is a display system. In an alternative implementation, a data system uses data other than video data. In this case, the scan converter system stores and retrieves data using buffer pages and a buffer page controller for controlling buffer page geometry. Returning to video data system 1300, data source 1305 provides pixel data according to horizontal rows of pixels and data destination 1315 receives pixel data according to vertical columns of pixels, as described above. Scan converter system 1310 provides the conversion. In alternative implementations, data destination 1315 can be some other video device that uses pixel data corresponding to vertical columns of pixels, such as a graphics card or a video image processor (e.g., for image transformations).

Data source 1305 can be implemented to provide pixel data according to various screen resolutions, such as an HD resolution of 1920×1080. While the discussion herein focuses on this HD resolution, alternative implementations can accommodate other resolutions. For an HD resolution signal, data source 1305 provides pixel data for a progressive signal (e.g., 1920×1080p). Data source 1305 can be implemented to receive an interlaced signal (e.g., 1920×1080i) and provide a progressive signal, such as by merging interlaced fields using a de-interlacer. In an alternative implementation, data source 1305 provides an interlaced signal, providing pixel data for half the screen pixels (i.e., first field) and then pixel data for the other half (i.e., second field). In another implementation, data source 1305 provides pixel data using progressive segmented frames ("PSF," by Sony Corporation of Japan, Inc.).

Each pixel has 32 bits of pixel data. In one implementation, 11 bits are for red, 11 bits are for green, and 10 bits are for blue. Alternative implementations may have different allocations (e.g., 10 bits per color) or pixel depths (e.g., 8 or 24 bits per pixel). Where data source 1305 provides pixel data at 1920×1080p and 32 bits per pixel, the pixel rate is approximately 150 MP/S and the data rate from data source 1305 is approximately 600 MB/S. Accordingly, scan converter system 1310 stores pixel data from data source 1305 at a data rate of approximately 600 MB/S. To provide pixel data at a rate to support the same resolution, 1920×1080p, scan converter system 1310 outputs pixel data to data destination 1315 at a data rate of approximately 600 MB/S.

Data destination 1315 can be a GLV system. One color GLV system includes three GLV's: one for red, one for green, and one for blue. As described above, a GLV uses vertical columns of pixels to form an image (projecting one column at a time, typically left to right). In a color GLV system, each GLV projects a column of pixels (e.g., 1088 pixels, though only 1080 may have corresponding pixel data from the video data source) at a time. The three color columns are combined (such as using mirrors and lenses) to form a single apparent column on the viewing area (not shown in FIG. 13). Accordingly, it is advantageous for the GLV system to receive pixel data according to vertical columns of pixels, rather than horizontal rows. Scan converter system 1310 provides the pixel data to the GLV system corresponding to vertical columns of pixels.

B. Pixel Page System Using Two Memory Devices

An HD implementation (1920×1080 screen resolution) of a system including a pixel page controller is described below. This implementation is illustrative of the operation of one system and alternative implementations are possible. The operation of this system is similar to the pixel page systems described in application Ser. No. 10/051,538, filed Jan. 16, 2002 (Attorney Docket No. 71743), except that the pixel page geometry is not fixed. The pixel page controller can change the pixel page geometry used. Altering the pixel page geometry may affect the generation of addresses for storing and retrieving pixel data.

Figure 4:
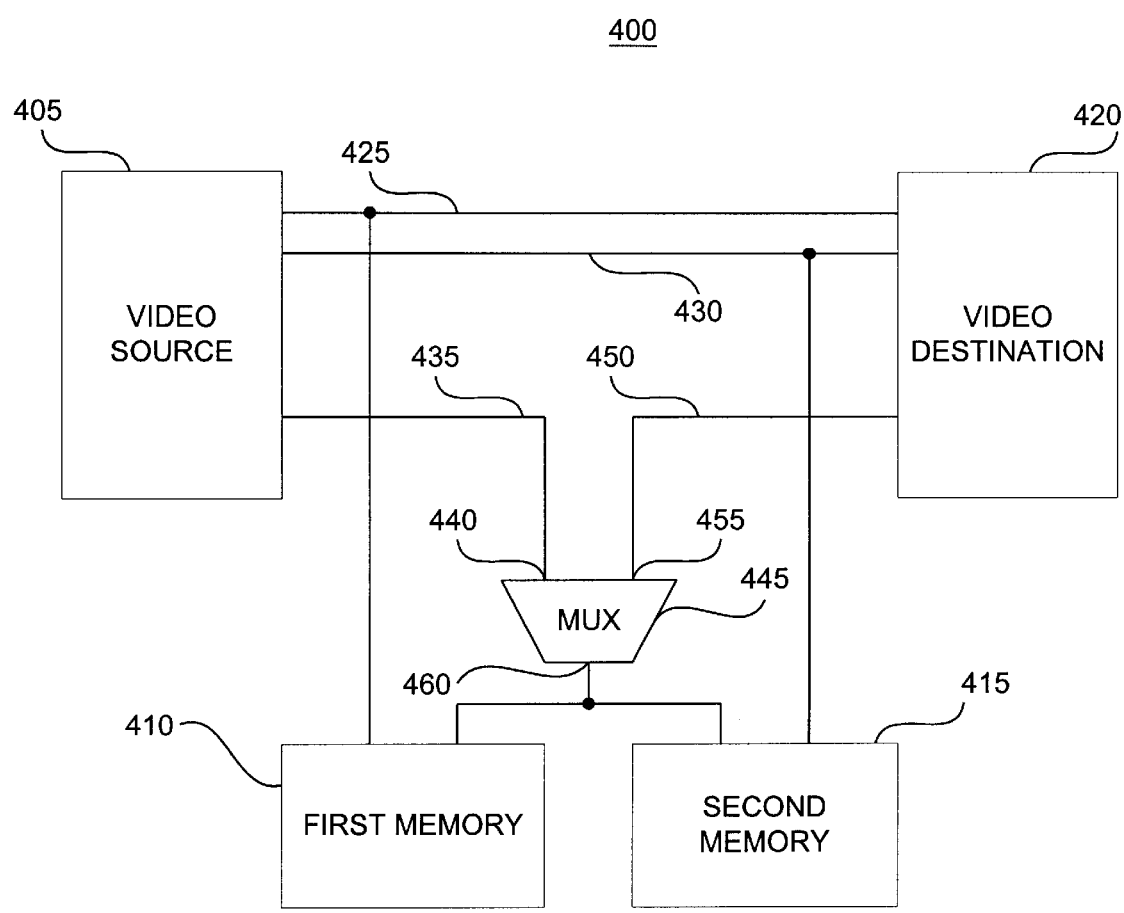
FIG. 4 is a block diagram of a typical frame buffer architecture capable of accessing pixel data for two pixels in parallel.
Figure 5:
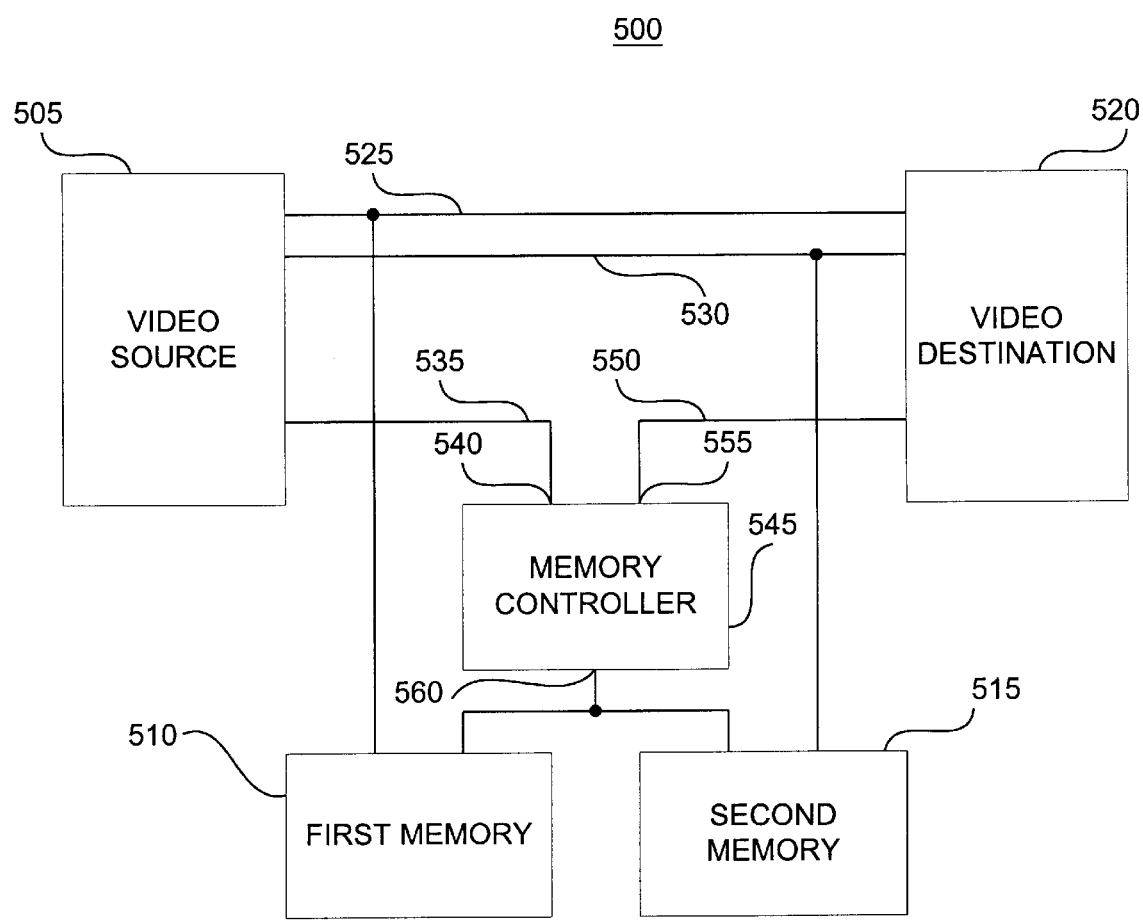
FIG. 5 is a block diagram of another implementation of a dual pixel frame buffer architecture.
Figures 6A, 6B, 6C:
FIG. 6A is a representation of 2,097,152 memory locations as a one-dimensional array.
FIG. 6B is a representation of 2,097,152 memory locations as a two-dimensional array or grid.
FIG. 6C is a representation of an address for one memory location out of 2,097,152.
Figure 14:
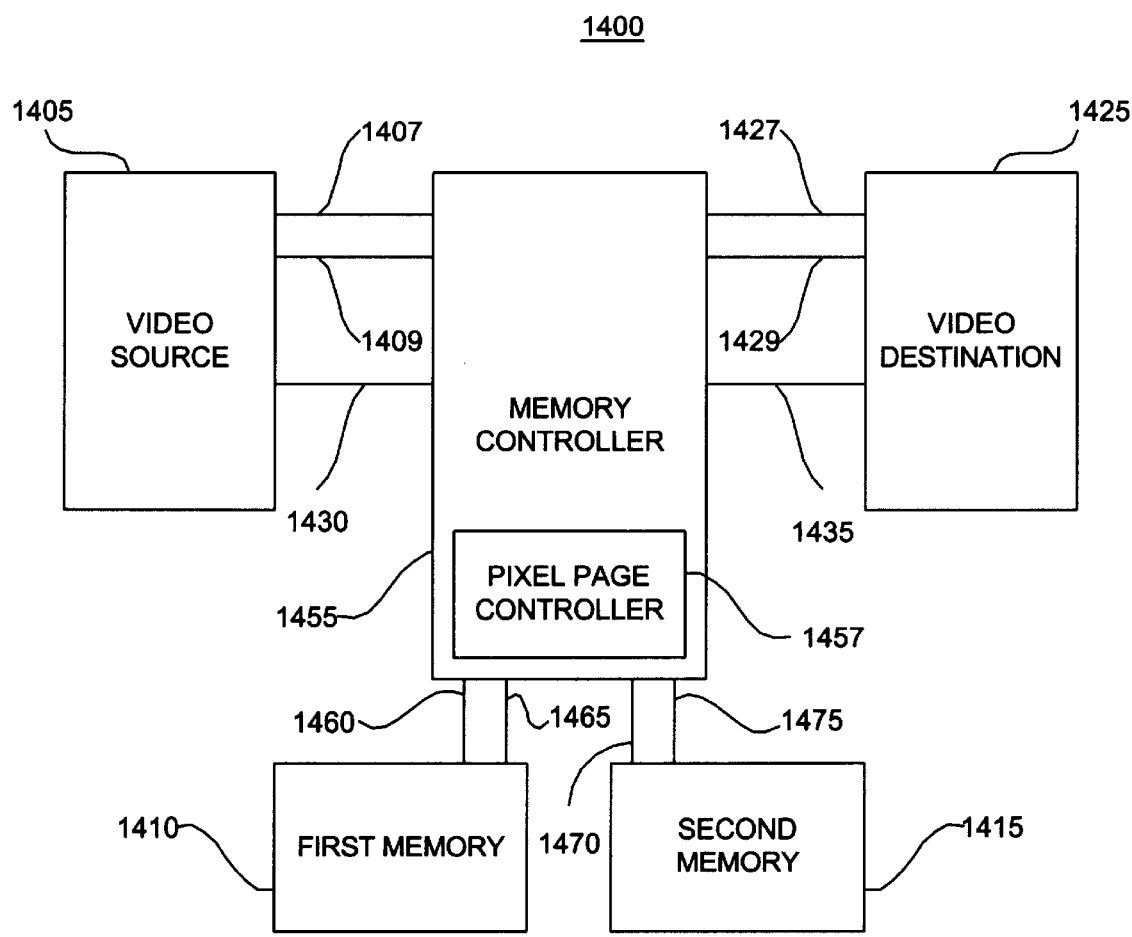
FIG. 14 is a block diagram of a dual pixel frame buffer architecture according to the present invention.

FIG. 14 is a block diagram of a dual pixel frame buffer architecture 1400. Architecture 1400 is similar to architectures 400 and 500 in FIGS. 4 and 5, respectively, however, architecture 1400 includes a memory controller 1455 centrally interconnecting video source 1405, video destination 1425, first memory 1410 and second memory 1415. Memory controller 1455 controls routing pixel data from video source 1405 to memories 1410 and 1415 and routing pixel data from memories 1410 and 1415 to video destination 1425. Memory controller 1455 controls the operation of memories 1410 and 1415, such as the read or write state, and also generates addresses for storing pixel data to and retrieving data from memories 1410 and 1415, as described below. In an alternative implementation, separate address generators for storing and retrieving data provide addresses to memory controller 1455. In another alternative implementation, a separate memory controller is provided for and connected to each memory and generates addresses for the connected memory.

Memory controller 1455 includes a pixel page controller 1457. Pixel page controller 1457 sets the pixel page geometry for pixel pages. Memory controller 1455 uses the pixel pages to store and retrieve pixel data. Pixel page controller 1457 evaluates the screen resolution of the frame corresponding to the pixel data being received at memory controller 1455 and selects a pixel page geometry to reduce page misses while conserving memory use. Pixel page controller 1457 also controls the allocation of pixel pages within the frame. Selecting a pixel page geometry and pixel page allocation are described below referring to FIG. 15. In alternative implementations different or additional evaluation and selection criteria can be used. For example, pixel page controller 1457 can evaluate the data rate needed to support the screen resolution, the size of memory pages, the availability of burst accessing, and/or the number of memory devices available. Similarly, pixel page controller 1457 can use a desired data rate or maximizing the output data rate as selection criteria. In one implementation, for an HD resolution of 1920×1080, pixel page controller 1457 sets the pixel page geometry to be 32×16 and allocates 4080 pixel pages, 60 horizontally by 68 vertically. 4080 pixel pages can include 2,088,960 pixels, which is close to the 2,073,600 pixels in an HD resolution of 1920×1080. In an alternative implementation, video source 1405 includes pixel page controller 1457 and provides information to control pixel page geometry and allocation to memory controller 1455 through control line 1430. In another implementation, video source 1405 instructs pixel page controller 1457 which pixel page geometry and allocation to use.

Memory controller 1455 operates to provide the mapping of pixel pages from pixels to memory locations. In aspects other than pixel pages, such as setting pixel page geometry and generating addresses, architecture 1400 operates similarly to dual pixel architectures 400 and 500, as described above. In alternative implementations, an architecture structurally similar to architecture 400 or architecture 500 can be used (e.g., an architecture including address multiplexors and having address generation controlled by video source and video destination), with modifications as described below.

A video source 1405 provides pixel data to a first memory 1410 and to a second memory 1415 in parallel and a video destination 1425 retrieves pixel data from first memory 1410 and from second memory 1415 in parallel. First memory 1410 and second memory 1415 are separate memory devices, such as two 32-bit wide 8 MB SDRAM's (e.g., 2M×32 SDRAM MT48LC2M32B2 by Micron Technology, Inc.). The SDRAM is preferably fast enough to support the data rate needed for the screen resolution, such as 150 MHz or 166 MHz. Other types of memory can also be used, such as SGRAM (synchronous graphics RAM). Memories 1410 and 1415 each store half the pixel data of a particular frame.

Video source 1405 receives video data from another source (not shown), such as a broadcast source or a software application running on a computer system connected to video source 1405. Video source 1405 outputs pixel data for pixels two at a time, a first pixel on a first data bus 1407 and a second pixel on a second data bus 1409.

Video destination 1425 provides pixel data to a display system (not shown in FIG. 14), such as data destination 1315 in FIG. 13 implemented as a GLV system. Video destination 1425 receives pixel data for pixels two at a time, a first pixel on a third data bus 1427 and a second pixel on a fourth data bus 1429. Video destination 1425 retrieves pixel data for two columns of pixels in parallel, so video destination 1425 buffers pixel data while sending pixel data to data destination 1315 one column at a time. In another implementation, video destination 1425 provides pixel data for two columns of pixels at a time to data destination 1315. In this case, data destination 1315 buffers the second column while displaying the first. In one implementation, video source 1405 and video destination 1425 include FIFO buffers, such as to avoid buffer overrun or underrun. In another implementation, these FIFO buffers are included in memory controller 1455.

First data bus 1407 and second data bus 1409 are connected to video source 1405 and memory controller 1455. Third data bus 1427 and fourth data bus 1429 are connected to video destination 1425 and memory controller 1455. Memory controller 1455 receives signals from video source 1405 and video destination 1425 through control lines 1430 and 1435, respectively, for pixel page geometry control (e.g., indicating the screen resolution) or addressing (e.g., indicating whether pixel data is to be stored to or retrieved from memories 1410 and 1415), or that horizontal and vertical synchronization signals have been received (e.g., to indicate the end of a frame row of pixels or the end of a frame, respectively). A first memory data bus 1460 and a first memory address bus 1465 are connected to memory controller 1455 and first memory 1410. A second memory data bus 1470 and a second memory address bus 1475 are connected to memory controller 1455 and second memory 1415. First memory 1410 and second memory 1415 also receive control signals (not shown) from memory controller 1455 to control whether memories 1410 and 1415 will read in data (write mode) or read out data (read mode). In addition, while clock lines are not shown in FIG. 14, architecture 1400 operates based on clock cycles so that pixel data can be processed for two pixels per clock cycle in support of the desired pixel rate.

In operation, memories 1410 and 1415 read in or store complementary halves of a frame of pixels as pixel data from video source 1405 and output the pixel data to video destination 1425. Memory controller 1455 controls pixel page geometry and address generation to map pixel data to memory locations. Initially, pixel page controller 1457 sets the pixel page geometry and pixel page allocation. As described above, memory controller 1455 stores pixel data for a frame of pixels from video source 1405 two pixels at a time according to horizontal rows of pixels. After storing one frame, memory controller 1455 retrieves the pixel data two pixels at a time according to vertical columns of pixels and provides the pixel data to video destination 1425. After retrieving the pixel data for the entire frame, memory controller 1455 stores pixel data for the next frame, and so on. Some pixel data for the next frame may be buffered, such as in video source 1405, while pixel data for the previous frame is being retrieved. In alternative implementations, the storage and retrieval can be interleaved or occur in parallel. If the environment changes, such as the screen resolution, pixel page controller 1457 adjusts the pixel page geometry and pixel page allocation as appropriate.

Figure 15:
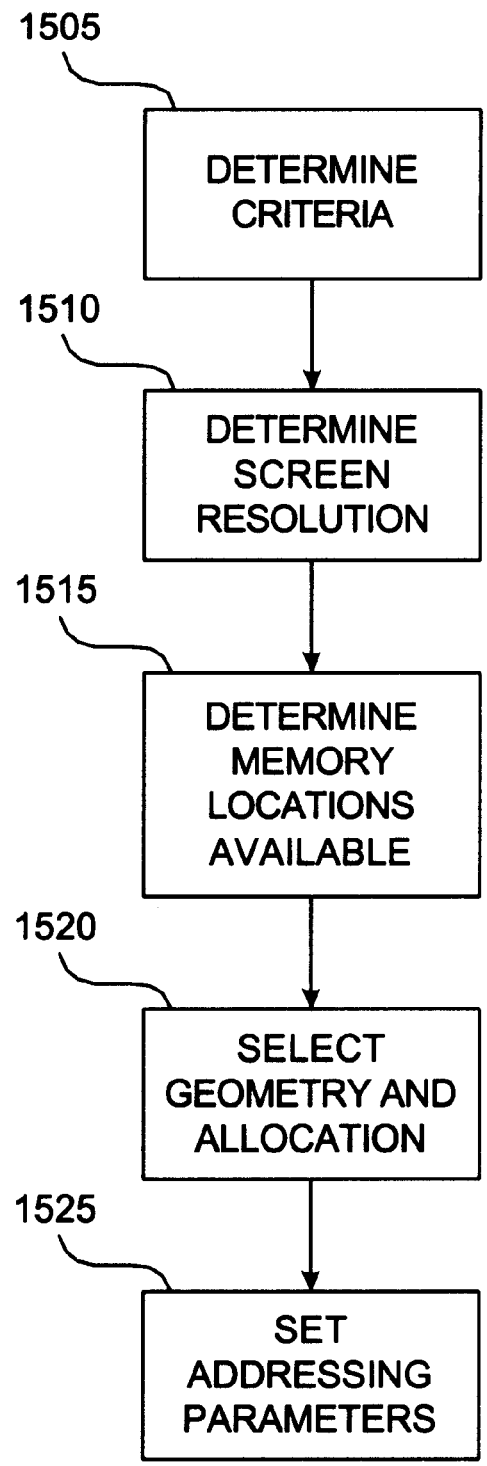
FIG. 15 is a flowchart of setting pixel page geometry and pixel page allocation according to the present invention.

FIG. 15 is a flowchart of setting pixel page geometry and pixel page allocation. Referring to architecture 1400 in FIG. 14, pixel page controller 1457 determines one or more criteria for selecting a pixel page geometry and how to allocate pixel pages, block 1505. In one implementation, video source 1405 provides the criteria to memory controller 1455 through control line 1430. Video destination 1425 can also provide criteria to memory controller through control line 1435. Various criteria and combinations of criteria can be used, such as reducing page misses, reducing effective page misses, conserving memory use, allocating blocks of pixel pages including a number of pixel pages equal to a power of two, and maximizing the output data rate.

Pixel page controller 1457 determines the screen resolution of the frame of pixels corresponding to the video data being received by memory controller 1455 from video source 1405, block 1510. In one implementation, video source 1405 provides screen resolution information to memory controller 1455 through control line 1430. In an alternative implementation, memory controller 1455 stores pixel data for an initial frame of pixels using a default pixel page geometry and tracks horizontal and vertical synchronization signals. Pixel page controller 1457 analyzes the data and signals to determine the screen resolution. In an alternative implementation, pixel page controller 1457 also determines the data rate needed to support the screen resolution at this point.

Pixel page controller determines how many memory locations and how many memory devices are available, block 1515. In one implementation, video source 1405 provides this information to memory controller 1455 through control line 1430. In an alternative implementation, memory controller 1455 queries the connected memory devices (e.g., memories 1410 and 1415) for this information. In one implementation, memory controller 1455 includes multiple ports for connecting to respective memory devices (each port including an address bus and a data bus) and memory controller 1455 polls the ports for connected memory devices. Pixel page controller 1457 can also determine at this point whether burst accessing is available or not.

Pixel page controller 1457 uses the one or more criteria, the screen resolution, and the available memory to select a pixel page geometry and pixel page allocation, block 1520. Tn one implementation, pixel page controller 1457 selects one of a set of available pixel page geometries, such as selecting one of 16×16, 32×16, 16×32, and 8×32. Pixel page controller 1457 selects the geometry that best satisfies the one or more criteria as applied to the screen resolution and available memory. In an alternative implementation, pixel page controller 1457 can freely set the dimensions of the pixel page geometry, subject to the one or more criteria. Generally, a more symmetrical pixel page causes less page misses, but may waste some memory if each memory page is not filled. Similarly, pixel page controller 1457 selects a pixel page allocation that best satisfies the one or more criteria as applied to the screen resolution and available memory. For example, as described in application Ser. No. 10/051,538, filed Jan. 16, 2002 (Attorney Docket No. 71743), allocating pixel pages to match a screen resolution conserves memory while allocating numbers of pixel pages horizontally and vertically that are powers of 2 is convenient for addressing using bit fields. In one implementation, pixel page controller 1457 compares a number of pixel page geometries and allocations, such as four, and ranks each according to meeting the current criteria. Pixel page controller 1457 selects the pixel page geometry and allocation that best match the criteria, such as by which geometry or allocation has the average highest ranking among the criteria.

In one implementation, the criteria are reducing page misses and conserving memory, the screen resolution is 1920×1080, and the available memory is two 8 MB SDRAM's each having 256 4-byte memory locations per page. In this implementation, pixel page controller 1457 selects a pixel page geometry of 32×16 and a pixel page allocation of 60×68. A pixel page geometry of 32×16 in a 1920×1080 frame causes 130,080 page misses, as described above. A pixel page geometry of 32×16 uses all of the memory locations in the corresponding memory pages (16*16=256 for each of two memory pages) and so conserves memory. An allocation of 60×68 pixel pages fills each pixel page with pixels except for eight pixel page rows in each pixel page in the bottom row of pixel pages (the $68^{th}$ row) and so conserves pixel pages. If burst accessing is also available, pixel page controller 1457 selects a pixel page geometry of 16×32 because this geometry causes only 32,640 effective page misses for a 1920×1080 frame, as described above. If one memory device is available instead of two, and the other factors stay the same, pixel page controller 1457 selects a pixel page geometry of 16×16. For a one memory device architecture using burst accessing, pixel page controller 1457 selects a pixel page geometry of 8×32.

Returning to FIG. 15, after selecting the pixel page geometry and pixel page allocation, pixel page controller 1457 and memory controller 1455 set addressing controls to use the selected pixel page geometry and pixel page allocation, block 1525. As described in application Ser. No. 10/051,538, filed Jan. 16, 2002 (Attorney Docket No. 71743), addressing may change according to the pixel page geometry and pixel page allocation. For example, if pixel 16 is in the same pixel page as pixel 15 or not changes the address for pixel data for pixel 16. In another example, in one implementation, addressing while using a pixel page allocation of 60×68 for a 1920×1080 frame uses state addressing, while addressing using a pixel page allocation of 64×128 for a 1920×1080 uses bit-field addressing. Setting the state variables in state addressing is described below. If the environment changes, such as the screen resolution changing or one or more criteria changes, pixel page controller 1457 begins the process of setting the pixel page geometry and pixel page allocation again by returning to block 1505.

As described above, where the criteria are reducing page misses and conserving memory, for an HD resolution of 1920×1080, pixel page controller 1457 sets the pixel page geometry to be 32×16 and allocates 4080 pixel pages, 60 horizontally by 68 vertically. A 32×16 pixel page is shown in FIG. 11. Storing and retrieving pixel data for this environment, pixel page geometry, and pixel page allocation is described below. Alternative pixel page geometries and pixel page allocations may store and retrieve data differently. Various additional illustrative implementations of storing and retrieving pixel data using pixel pages are described in application Ser. No. 10/051,538, filed Jan. 16, 2002 (Attorney Docket No. 71743). Variations of these illustrative implementations to meet different pixel page geometries and pixel page allocations will be apparent to one of ordinary skill in the art.

Figure 16:
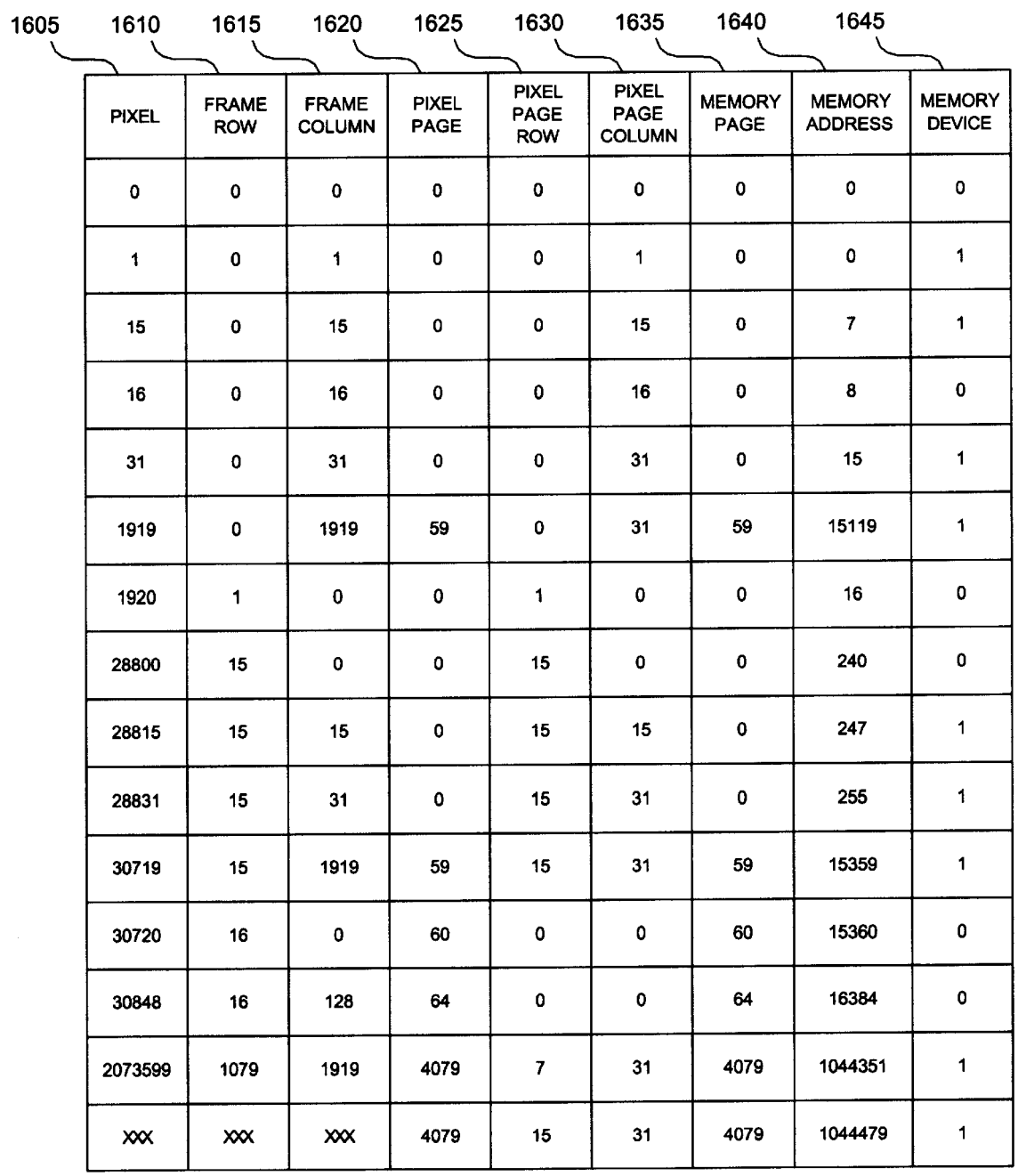
FIG. 16 is a table showing the relationships among a pixel, a frame row, a frame column, a pixel page, a pixel page row, a pixel page column, a memory page, a memory address, and a memory device for an HD resolution implementation (1920×1080) according to the present invention.

FIG. 16 is a table 1600 showing the relationships among a pixel, a frame row, a frame column, a pixel page, a pixel page row, a pixel page column, a memory page, a memory address, and a memory device for an HD resolution implementation (1920×1080) using pixel pages 1105 in FIG. 11. In FIG. 16, the pixel data for a frame is stored in two memory devices, each having 256 memory locations per memory page. In addition, FIG. 16 shows only a representative sample of pixels from a frame for clarity. As described above, an HD resolution frame has 2,073,600 pixels.

Column 1605 indicates the number of a pixel for which related information is shown in table 1600. Pixels in a frame are numbered from 0, left to right, top to bottom. For example, the first pixel in the frame is numbered 0, the last pixel of the first frame row is numbered 1919, and the first pixel of the second frame row is numbered 1920. Column 1610 indicates a frame row including the pixel in column 1605. Frame rows are numbered from 0, top to bottom. Column 1615 indicates a frame column including the pixel in column 1605. Frame columns are numbered from 0, left to right. Column 1620 indicates a pixel page including the pixel in column 1605. Pixel pages in a frame are numbered from 0, left to right, top to bottom. Column 1625 indicates a pixel page row including the pixel in column 1605. Pixel page rows are numbered from 0, from top to bottom within the pixel page including the pixel page row. Column 1630 indicates a pixel page column including the pixel in column 1605. Pixel page columns are numbered from 0, left to right within the pixel page including the pixel page column. Column 1635 indicates a memory page storing pixel data for the pixel in column 1605. Memory pages are numbered sequentially from 0. Column 1640 indicates a memory address of a memory location storing pixel data for the pixel in column 1605. Column 1645 indicates which memory device stores pixel data for the pixel in column 1605. The two memory devices are numbered 0 and 1. XXX indicates an invalid screen pixel, frame row, or frame column. Invalid screen pixels, frame rows, and frame columns are outside the dimensions of the screen resolution (e.g., frame rows beyond 1079 in HD resolution 1920×1080). Memory locations are allocated for invalid screen pixels, frame rows, and frame columns in allocated pixel pages, but these memory locations are not used.

As described above, two pixels have pixel data stored at the same address in different devices. For example, the first pixel of a frame is pixel 0, in frame row 0 and frame column 0, in pixel page row 0 and pixel page column 0 of pixel page 0, stored at memory address 0 in memory page 0 of memory device 0. The second pixel of a frame (horizontally) is pixel 1, in frame row 0 and frame column 1, in pixel page row 0 and pixel page column 1 of pixel page 0, stored at memory address 0 in memory page 0 of memory device 1.

Some pixel pages at the end of each column of pixel pages do not include valid screen pixels. 68 pixel pages are allocated vertically to the frame. Each pixel page is 16 pixels tall and so 68 pixel pages can include a column of 1088 pixels vertically. However, an HD resolution frame is only 1080 pixels tall and so has valid screen pixels for 67 pixel pages and 8 pixel page rows of a 68$^{th}$ pixel page, vertically. As a result, eight pixel page rows in each of the pixel pages in the 68$^{th}$ row of pixel pages (i.e., pixel pages 4020 through 4079) do not include valid screen pixels. For example, pixel 2073599 (i.e., the last pixel of the last frame row) is in pixel page row 7 of pixel page 4079 and pixel data for pixel 2073599 is stored at address 1044351. Pixel page rows 8 through 15 of pixel page 4079 do not include valid screen pixels. However, memory page 4079 includes 256 memory locations with addresses from 1044224 through 1044479. Addresses 1044352 through 1044479 are not used in each memory device. A similar situation occurs in each of the memory pages corresponding to the 68$^{th}$ row of pixel pages (i.e., memory pages 4020 through 4079).

Memory controller 1455 stores pixel data according to horizontal rows of pixels. Memory controller 1455 generates source addresses to store pixel data for two pixels in parallel. In an HD resolution implementation, memory controller 1455 stores pixel data for pixel pairs in this sequence (first memory 1410–second memory 1415): 0–1, 2–3, 4–5, and so on. Referring to FIG. 16, memory controller 1455 generates addresses in the following sequence (one address for each pixel pair): 0, 1, . . . , 15, 256, 257, . . . , 271, 512, . . . , 15119, 16, 17, and so on. As described above, pixel data for pixels in different pixel pages is stored in different memory pages.

Figure 17:
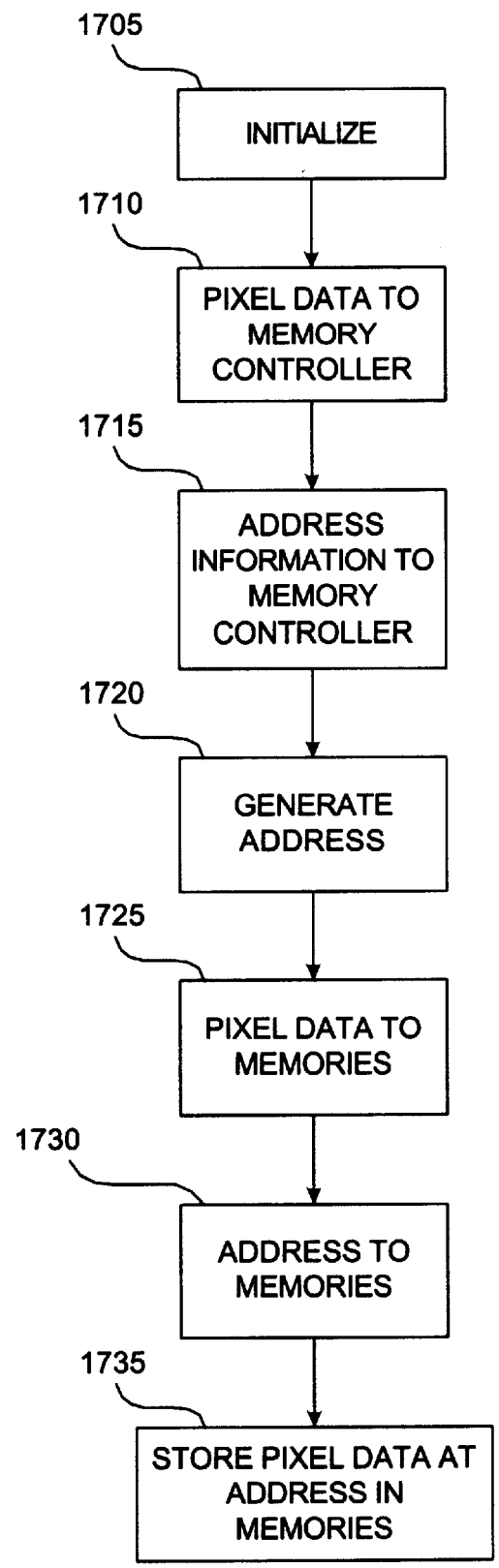
FIG. 17 is a flowchart of storing pixel data according to the present invention.

FIG. 17 is a flowchart of storing pixel data using architecture 1400 in FIG. 14. To store pixel data, memories 1410, 1415 are put in write mode and memory controller 1455 is set to provide pixel data from data buses 1407, 1409 to memories 1410, 1415, respectively, block 1705. Video source 1405 provides pixel data for a first pixel pair to memory controller 1455 through data buses 1407, 1409, respectively, block 1710. Video source 1405 also provides address information to memory controller 1455 through control line 1430, block 1715. The address information indicates that memory controller 1455 is to store data to memory 1410. Alternatively, video source 1405 provides the address information to memory controller 1455 once at the beginning of storage, such as at block 1705. Memory controller 1455 generates a source address, as described below, to store the pixel data, block 1720. In alternative implementations, video source 1405 can generate the addresses for storing pixel data and pass the addresses to memory controller 1455.

Memory controller 1455 passes the data from data buses 1407, 1409 to memories 1410, 1415 through memory data buses 1460, 1470, respectively, block 1725. Memory controller 1455 provides the address to memories 1410, 1415 through memory address buses 1465, 1475, respectively, block 1730. Memory 1410 stores the pixel data on memory data bus 1460 at the address on memory address bus 1465 and memory 1415 stores the pixel data on memory data bus 1470 at the address on memory address bus 1475, block 1735. To store pixel data for the next pixel, video source 1405 returns to block 1710, or to block 1705 to restore the state of architecture 1400 for storage.

Figure 18:
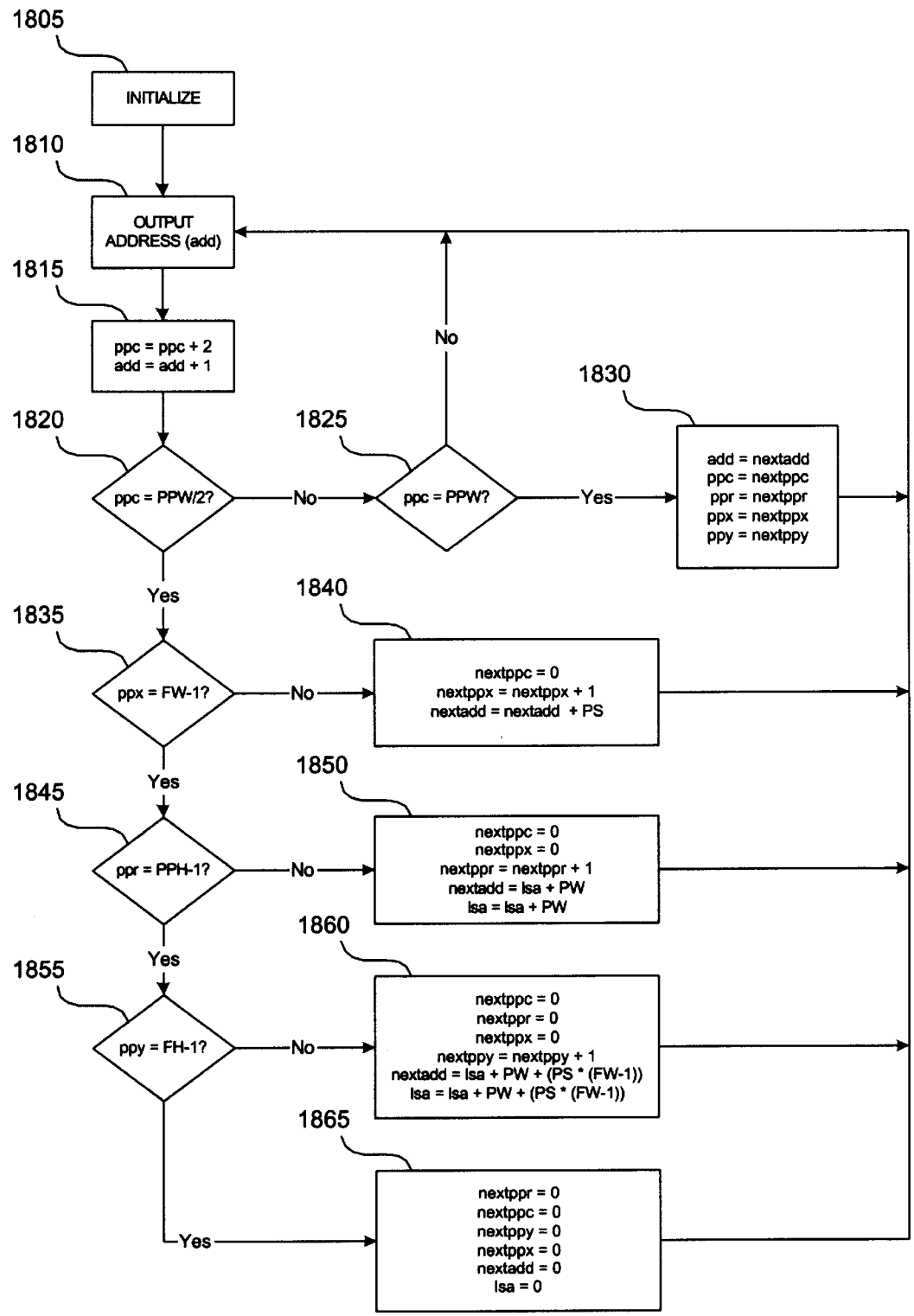
FIG. 18 is a flowchart of generating source addresses for storing pixel data according to the present invention.

FIG. 18 is a flowchart of generating source addresses for storing pixel data. As described above, one implementation uses architecture 1400, a pixel page geometry of 32×16, and allocates 60 pixel pages horizontally and 68 pixel pages vertically. Several counter variables are shown in FIG. 18. These counter variables can be values stored in memory or separate counters. "add" is the address generated and output at block 1810. "ppc" counts pixel page columns. "ppr" counts pixel page rows. "ppx" counts pixel pages horizontally. "ppy" counts pixel pages vertically. "nextadd,"

"nextppc," "nextppr," "nextppx," "nextppy" are holding variables for assignment. "Isa" holds the left side address for the beginning of a frame row, i.e., the address to start from when generating addresses at the beginning of a row of pixels. Several constants are also shown in FIG. 18. "FW" is the frame width, indicating the number of pixel pages allocated horizontally. FW is 60 in this implementation. "FH" is the frame height, indicating the number of pixel pages allocated vertically. FH is 68 in this implementation. "PW" is the page width, indicating the number of memory locations in each memory device allocated to pixels in one pixel page row. PW is 16 in this implementation. "PS" is the page size, indicating the number of memory locations in each memory device allocated to pixels in a pixel page. PS is 256 in this implementation. "PPW" is the pixel page width, indicating the width of a pixel page in pixels. Using a pixel page geometry of 32×16, PPW is 32. "PPH" is the pixel page height, indicating the height of a pixel page in pixels. Using a pixel page geometry of 32×16, PPH is 16. The values of these constants are set by pixel page controller 1457 when setting the pixel page geometry and pixel page allocation, such as described above referring to block 1525 in FIG. 15. If the pixel page geometry or pixel page allocation changes, pixel page controller 1457 adjusts these constants appropriately.

At the beginning of storing pixel data for a frame, memory controller 1455 resets the variables add, ppc, ppr, ppx, ppy, nextadd, nextppc, nextppr, nextppx, nextppy, and 1sa to 0, block 1805. FW, FH, PW, PS, PPW, and PPH do not change from frame to frame (unless the environment changes and pixel page controller 1457 changes one or more of these constants). Memory controller 1455 outputs the value of add as the address, block 1810. Memory controller 1455 increments add by 1 and ppc by 2, block 1815. Memory controller 1455 increments ppc by 2 because pixel data for two horizontally neighboring pixels is stored in parallel. Memory controller 1455 compares ppc with PPW/2, block 1820. PPW/2 indicates the horizontal middle of the pixel page. Where PPW is 32, PPW/2 is 16. In some implementations, the amount of time required to perform some of the calculations in FIG. 18 may be more than a pixel time, and so using PPW/2 as a branching point allows more time for some calculations to complete. Accordingly, processing may move from one block to another in FIG. 18 before the calculation shown in a block has completed. Alternatively, a value other than the horizontal middle of the pixel page can be used.

If ppc does not equal PPW/2, memory controller 1455 checks if the end of a pixel page has been reached by comparing ppc with PPW, block 1825. If ppc does not equal PPW, the end of the pixel page has not been reached, and memory controller 1455 proceeds to block 1810. If ppc equals PPW, the end of the pixel page has been reached. Memory controller 1455 prepares for the next pixel page by assigning counter variables the values of corresponding holding variables, block 1830, and proceeds to block 1810.

Returning to block 1820, if ppc equals PPW/2, memory controller 1455 checks if the last pixel page in the row of pixel pages has been reached by comparing ppx with FW−1, block 1835. Where FW is 60, FW−1 is 59. If ppx does not equal FW−1, the last pixel page in the row has not been reached. Memory controller 1455 prepares holding variables for the end of the pixel page row (to be used in block 1830), block 1840, and proceeds to block 1810.

If ppx equals FW−1, the last pixel page in the row has been reached, and memory controller 1455 checks if the last pixel page row in the pixel page has been reached by comparing ppr with PPH−1, block 1845. Where PPH is 16, PPH−1 is 15. If ppr does not equal PPH−1, the last pixel page row has not been reached. Memory controller 1455 prepares holding variables for the end of the pixel page row (to be used in block 1830), block 1850, and proceeds to block 1810.

If ppr equals PPH−1, the last pixel page row has been reached, and memory controller 1455 checks if the last pixel page in the column of pixel pages has been reached by comparing ppy with FH−1, block 1855. Where FH is 68, FH−1 is 67. If ppy does not equal FH−1, the last pixel page in the column has not been reached. Memory controller 1455 prepares holding variables for the end of the pixel page row (to be used in block 1830), block 1860, and proceeds to block 1810. If ppy equals FH−1, the last pixel page in the column has been reached. Memory controller 1455 prepares holding variables for the end of the pixel page row (to be used in block 1830), block 1865, and proceeds to block 1810. FIG. 18 shows a continuous loop and so memory controller 1455 continues to follow FIG. 18 from frame to frame for storing pixel data. If memory controller 1455 needs to re-start address generation for storing pixel data, such as to re-initialize the state of address generation, memory controller 1455 starts generating addresses again beginning with block 1805.

Memory controller 1455 retrieves pixel data according to vertical columns of pixels. Memory controller 1455 generates destination addresses to retrieve pixel data for two pixels in parallel. In an HD resolution implementation, memory controller 1455 retrieves pixel data for pixel pairs in this sequence (first memory 1410–second memory 1415): 0–1, 1920–1921, 3840–3841, and so on. Referring to FIG. 16, memory controller 1455 generates addresses in the following sequence (one address for each pixel pair): 0, 16, 32, . . . , 240, 15360, . . . , 1, 17, and so on. As described above, pixel data for pixels in different pixel pages is retrieved from different memory pages.

Figure 19:
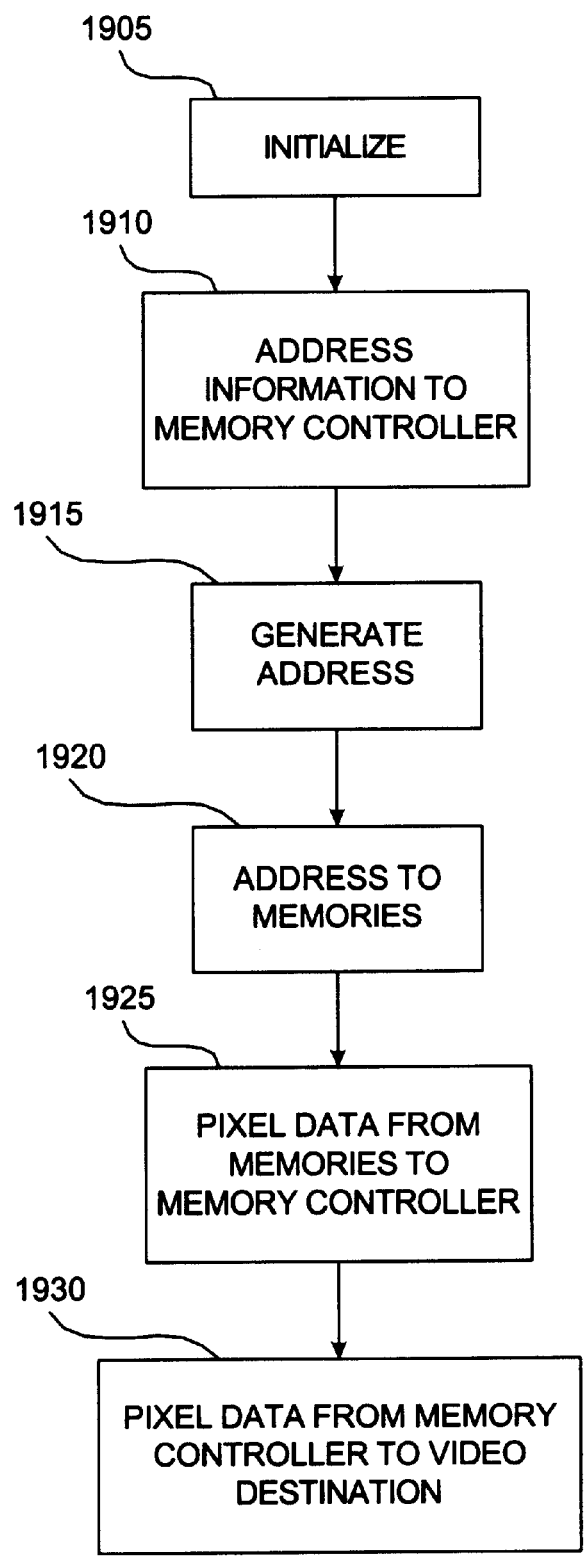
FIG. 19 is a flowchart of retrieving pixel data according to the present invention.

FIG. 19 is a flowchart of retrieving pixel data. To retrieve pixel data, memories 1410, 1415 are put in read mode and memory controller 1455 is set to provide pixel data from memories 1410, 1415 to data buses 1427, 1429, respectively, block 1905. Video destination 1425 provides address information to memory controller 1455 through control line 1435, block 1910. The address information indicates that memory controller 1455 is to read data from memories 1410, 1415. Alternatively, video destination 1425 provides the address information to memory controller 1455 once at the beginning of retrieval, such as at block 1905. Memory controller 1455 generates a destination address as described below to retrieve the pixel data, block 1915. In alternative implementations, video destination 1425 can generate the addresses for retrieving pixel data and pass the addresses to memory controller 1455.

Memory controller 1455 provides the destination address to memories 1410, 1415 through memory address buses 1465, 1475, respectively, block 1920. Memory 1410 provides the pixel data stored at the address on memory address bus 1465 to memory controller 1455 through memory data bus 1460, and memory 1415 provides the pixel data stored at the address on memory address bus 1475 to memory controller 1455 through memory data bus 1470, block 1925. Memory controller 1455 provides the pixel data from memories 1410, 1415 to video destination 1425 through data buses 1427, 1429, respectively, block 1930. To retrieve pixel data for the next pixel, video destination returns to block 1910, or to block 1905 to restore the state of architecture 1400 for retrieval.

Figure 20:
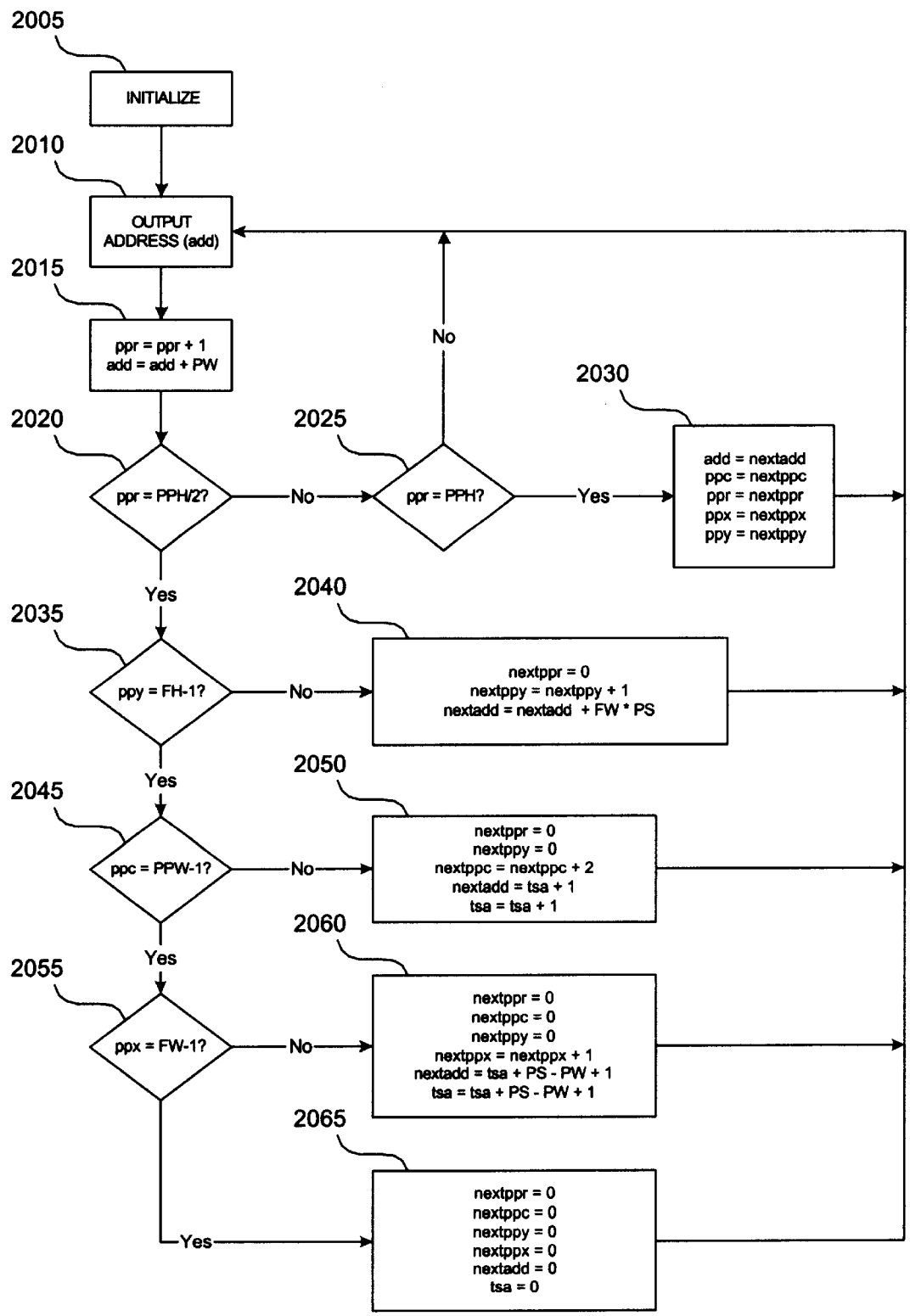
FIG. 20 is a flowchart of generating destination addresses for retrieving pixel data according to the present invention.

FIG. 20 is a flowchart of generating destination addresses for retrieving pixel data. As described above, one implementation uses architecture 1400, a pixel page geometry of 32×16, and allocates 60 pixel pages horizontally and 68 pixel pages vertically. As in FIG. 18, several variables and constants are shown in FIG. 20. "add" is the address generated and output at block 2010. "ppc" counts pixel page columns. "ppr" counts pixel page rows. "ppx" counts pixel pages horizontally. "ppy" counts pixel pages vertically. "nextadd," "nextppc," "nextppr," "nextppx," "nextppy" are holding variables for assignment. "tsa" holds the top side address for the beginning of a frame column, i.e., the address to start from when generating addresses at the beginning of a column of pixels. "FW" is the frame width, indicating the number of pixel pages allocated horizontally. FW is 60 in this implementation. "FH" is the frame height, indicating the number of pixel pages allocated vertically. FH is 68 in this implementation. "PW" is the page width, indicating the number of memory locations in each memory device allocated to pixels in one pixel page row. PW is 16 in this implementation. "PS" is the page size, indicating the number of memory locations in each memory device allocated to pixels in a pixel page. PS is 256 in this implementation. "PPW" is the pixel page width, indicating the width of a pixel page in pixels. Using a pixel page geometry of 32×16, PPW is 32. "PPH" is the pixel page height, indicating the height of a pixel page in pixels. Using a pixel page geometry of 32×16, PPH is 16. The values of these constants are set by pixel page controller 1457 when setting the pixel page geometry and pixel page allocation, such as described above referring to block 1525 in FIG. 15. If the pixel page geometry or pixel page allocation changes, pixel page controller 1457 adjusts these constants appropriately.

At the beginning of retrieving pixel data for a frame, memory controller 1455 resets the variables add, ppc, ppr, ppx, ppy, nextadd, nextppc, nextppr, nextppx, nextppy, and tsa to 0, block 2005. FW, FH, PW, PS, PPW, and PPH do not change from frame to frame (unless the environment changes and pixel page controller 1457 changes one or more of these constants). Memory controller 1455 outputs the value of add as the address, block 2010. Memory controller 1455 increments ppr by 1 and add by PW, block 2015. Memory controller 1455 compares ppr with PPH/2, block 2020. PPH/2 indicates the vertical middle of the pixel page. Where PPH is 16, PPH/2 is 8. As described above referring to FIG. 18, using PPH/2 as a branching point allows more time for some calculations to complete.

If ppr does not equal PPH/2, memory controller 1455 checks if the end of a pixel page has been reached by comparing ppr with PPH, block 2025. If ppr does not equal PPH, the end of the pixel page has not been reached, and memory controller 1455 proceeds to block 2010. If ppr equals PPH, the end of the pixel page has been reached. Memory controller 1455 prepares for the next pixel page by assigning counter variables the values of corresponding holding variables, block 2030, and proceeds to block 2010.

Returning to block 2020, if ppr equals PPH/2, memory controller 1455 checks if the last pixel page in the column of pixel pages has been reached by comparing ppy with FH−1, block 2035. Where FH is 68, FH−1 is 67. If ppy does not equal FH−1, the last pixel page in the column has not been reached. Memory controller 1455 prepares holding variables for the end of the pixel page column (to be used in block 2030), block 2040, and proceeds to block 2010.

If ppy equals FH−1, the last pixel page in the column has been reached, and memory controller 1455 checks if the last pixel page column in the pixel page has been reached by comparing ppc with PPW−1, block 2045. Where PPW is 16, PPW−1 is 15. If ppc does not equal PPW−1, the last pixel page column has not been reached. Memory controller 1455 prepares holding variables for the end of the pixel page column (to be used in block 2030), block 2050, and proceeds to block 2010.

If ppc equals PPW−1, the last pixel page column has been reached, and memory controller 1455 checks if the last pixel page in the row of pixel pages has been reached by comparing ppx with FW−1, block 2055. Where FW is 60, FW−1 is 59. If ppx does not equal FW−1, the last pixel page in the row has not been reached. Memory controller 1455 prepares holding variables for the end of the pixel page column (to be used in block 2030), block 2060, and proceeds to block 2010. If ppx equals FW−1, the last pixel page in the row has been reached. Memory controller 1455 prepares holding variables for the end of the pixel page column (to be used in block 2030), block 2065, and proceeds to block 2010. Similar to FIG. 18, FIG. 20 shows a continuous loop and so memory controller 1455 continues to follow FIG. 20 from frame to frame for retrieving pixel data. If memory controller 1455 needs to re-start address generation for retrieving pixel data, such as to re-initialize the state of address generation, memory controller 1455 starts generating addresses again beginning with block 2005.

In alternative implementations, addresses generation for storing and retrieving pixel data can be different from that described above. For example, blocks 1820 and 1825 in FIG. 18 could be combined into a multi-branch block with outgoing paths depending on the value of ppc: one for ppc=PPW/2, one for ppc=PPW, and one for other values of ppc. In any case, the address generation used accommodates the storage pattern created by the pixel pages and the sequences for storing and retrieving data described above.

Various illustrative implementations of the present invention have been described. The above description focuses on HD resolution video data displayed using a GLV system, but the methods and apparatus can be applied to different resolutions and different devices, as well as data other than video data. Similarly, the pixel data for a pixel is described above as being 32 bits, but different depths are also possible with modification to the size of the addressed memory locations. In addition, while implementations using pixel pages based on two orders of accessing have been described, buffer pages can be formed to accommodate three or more orders of accessing as well. Dynamic pixel pages can also be used with a checkerboard buffer, as described in application Ser. No. 09/908,295, filed Jul. 17, 2001 (Attorney Docket No. 70673). The present invention can be implemented in electronic circuitry, computer hardware, software, or in combinations of them. For example, a frame buffer using pixel pages can be implemented in various ways, such as with an FPGA, a hardwired design, a microprocessor architecture, or a combination. However, one of ordinary skill in the art will see that additional implementations are also possible and within the scope of the present invention. Accordingly, the present invention is not limited to only those implementations described above.

What is claimed is:

1. A buffer page system, comprising:
 a data source, providing data elements in a first order;
 a data destination, receiving data elements in a second order, where each data element corresponds to an entry in one of a plurality of buffer pages, each buffer page having a plurality of entries along a first dimension corresponding to the first order and a plurality of entries along a second dimension corresponding to the second order;

at least one memory device, each memory device having a plurality of memory pages including a plurality of memory locations, each memory location having an address, where data elements are stored to each memory device in the first order and retrieved from each memory device in the second order, and where each memory page stores data elements in multiple locations according to the first order and stores data elements in multiple locations according to the second order; and a buffer page controller, where the buffer page controller controls the geometry of each buffer page.

2. The buffer page system of claim 1, where:

a data element is pixel data corresponding to a pixel in a frame of pixels, the frame having horizontal rows of pixels, vertical columns of pixels, and a screen resolution;

the buffer pages are pixel pages, each pixel page having a plurality of pixel page rows and a plurality of pixel page columns; and the buffer page controller is a pixel page controller and controls a pixel page geometry for pixel pages.

3. The buffer page system of claim 2, where the pixel page controller selects a pixel page geometry from a group of two or more available pixel page geometries.

4. The buffer page system of claim 2, where the pixel page controller sets the pixel page geometry according to an instruction received from the data source.

5. The buffer page system of claim 2, where the pixel page controller sets the pixel page geometry based on one or more criteria.

6. The buffer page system of claim 5, where the data source provides one or more criteria to the pixel page controller.

7. The buffer page system of claim 5, where one criterion is reducing page misses.

8. The buffer page system of claim 5, where one criterion is reducing effective page misses.

9. The buffer page system of claim 5, where one criterion is maximizing an output data rate.

10. The buffer page system of claim 5, where one criterion is conserving memory.

11. The buffer page system of claim 2, where the pixel page controller sets the pixel page geometry to be 16×32.

12. The buffer page system of claim 2, where the pixel page controller sets the pixel page geometry to be 8×32.

13. The buffer page system of claim 2, where the pixel page controller sets the pixel page geometry using the screen resolution of the frame of pixels.

14. The buffer page system of claim 2, where the pixel page controller sets the pixel page geometry using a size of the memory pages in each memory device.

15. The buffer page system of claim 2, where the pixel page controller sets the pixel page geometry using the number of memory devices available.

16. The buffer page system of claim 2, where the pixel page controller sets the pixel page geometry using whether or not burst accessing is available in each memory device.

17. The buffer page system of claim 2, where the pixel page controller also sets a pixel page allocation to control how many pixel pages are allocated to one frame of pixels.

18. The buffer page system of claim 2, where the pixel page controller adjusts the pixel page geometry as the screen resolution of the frame of pixels changes.

19. A method of controlling pixel page geometry, comprising:

determining one or more criteria for controlling pixel page geometry;

determining a screen resolution of a frame of pixels;

determining a number of memory locations available in a page of memory, where a page of memory corresponds to a pixel page; and selecting a pixel page geometry based on the one or more criteria, the screen resolution, and the number of memory locations available in a page of memory.

20. The method of claim 19, further comprising setting one or more addressing parameters to control addressing according to the selected pixel page geometry.

21. The method of claim 19, further comprising selecting a pixel page allocation to control how many pixel pages are allocated to one frame of pixels.

22. The method of claim 19, where one criterion is reducing page misses.

23. The method of claim 19, where one criterion is conserving memory.

24. The method of claim 19, where one criterion is maximizing an output data rate.

25. The method of claim 19, further comprising adjusting the pixel page geometry as the screen resolution of the frame of pixels changes.

26. The method of claim 19, further comprising receiving instructions for controlling pixel page geometry.

27. The method of claim 19, where determining one or more criteria for controlling pixel page geometry comprises receiving one or more criteria from a video source.

28. A system for controlling pixel page geometry, comprising:

means for determining one or more criteria for controlling pixel page geometry;

means for determining a screen resolution of a frame of pixels;

means for determining a number of memory locations available in a page of memory, where a page of memory corresponds to a pixel page; and means for selecting a pixel page geometry based on the one or more criteria, the screen resolution, and the number of memory locations available in a page of memory.

* * * * *